(12) United States Patent
Sabin et al.

(10) Patent No.: US 8,565,908 B2
(45) Date of Patent: Oct. 22, 2013

(54) SYSTEMS, METHODS, AND APPARATUS FOR EQUALIZATION PREFERENCE LEARNING

(75) Inventors: Andrew Todd Sabin, Chicago, IL (US); Bryan A. Pardo, Evanston, IL (US)

(73) Assignee: Northwestern University, Evanston, IL (US)

(*) Notice: Subject to any disclaimer, the term of this patent is extended or adjusted under 35 U.S.C. 154(b) by 604 days.

(21) Appl. No.: 12/846,456

(22) Filed: Jul. 29, 2010

(65) Prior Publication Data

US 2011/0029111 A1 Feb. 3, 2011

Related U.S. Application Data

(60) Provisional application No. 61/229,558, filed on Jul. 29, 2009.

(51) Int. Cl.
*G06F 17/00* (2006.01)
(52) U.S. Cl.
USPC ............................................. 700/94; 381/58
(58) Field of Classification Search
None
See application file for complete search history.

(56) References Cited

U.S. PATENT DOCUMENTS

2009/0238370 A1* 9/2009 Rumsey et al. ................ 381/58

OTHER PUBLICATIONS

Punch et al., "Prescriptive Hearing Aid Fitting by Parameter Adjustment and Selection", Journal of the American Academy of Audiology, vol. 3, No. 2, pp. 94-100, Mar. 1992.*
Moore et al., "Comparison of two adaptive procedures for fitting a multi-channel compression hearing aid", International Journal of Audiology, vol. 44, Issue 6, pp. 345-357, 2005.*
Kuk et al., "The Reliability of a Modified Simplex Procedure in Hearing Aid Frequency-Response Selection," Journal of Speech and Hearing Research, vol. 35, pp. 418-429, Apr. 1992 (12 pages).
Durant et al., "Efficient Perceptual Tuning of Hearing Aids With Genetic Algorithms," IEEE Transactions on Speech and Audio Processing, vol. 12, No. 2, pp. 144-155, Mar. 2004 (12 pages).

(Continued)

*Primary Examiner* — Andrew C Flanders
*Assistant Examiner* — David Siegel
(74) *Attorney, Agent, or Firm* — Hanley, Flight and Zimerman, LLC

(57) ABSTRACT

Systems, methods, and apparatus are provided for equalization preference learning for digital audio modification. A method for listener calibration of an audio signal includes modifying a reference sound using at least one equalization curve; playing the modified reference sound for a listener; accepting listener feedback regarding the modified reference sound; and generating a weighting function based on listener feedback. A listener audio configuration system includes an output providing a sound for listener review; an interface accepting listener feedback regarding the sound; and a processor programming an audio device based on listener feedback.

22 Claims, 15 Drawing Sheets

(56) References Cited

OTHER PUBLICATIONS

Baskent et al. "Using Genetic Algorithms with Subjective Input from Human Subjects: Implications for Fitting Hearing Aids and Cochlear Implants," Ear & Hearing, vol. 28, No. 3, Jun. 2007, pp. 370-380 (11 pages).

Punch et al., "Prescriptive Hearing Aid Fitting by Parameter Adjustment and Selection," Journal of the American Academy of Audiology, vol. 3, No. 2, pp. 94-100, Mar. 1992 (7 pages).

Franck et al., "Methodological aspects of an adaptive multidirectional pattern search to optimize speech perception using three hearing-aid algorithms," Journal of the Acoustical Society of America, vol. 116, Issue 6, pp. 3620-3628, Dec. 2004 (9 pages).

Moore et al., "Comparison of two adaptive procedures for fitting a multi-channel compression hearing aid," International Journal of Audiology, vol. 44, Issue 6, pp. 345-357, 2005 (13 pages).

Neuman et al. "An evaluation of three adaptive hearing aid selection strategies," Journal of the Acoustical Society of America, vol. 82, Issue 6, pp. 1967-1976, Dec. 1987 (10 pages).

Stelmachowicz et al. "Preferred Hearing.Aid Frequency Responses in Simulated Listening Environments," Journal of Speech and Hearing Research, vol. 37, pp. 712-719, Jun. 1994 (7 pages).

* cited by examiner

SYSTEMS, METHODS, AND APPARATUS FOR EQUALIZATION PREFERENCE LEARNING

CROSS-REFERENCE TO RELATED APPLICATIONS

The present application claims priority to U.S. Provisional Application No. 61/229,558, filed on Jul. 29, 2009, which is herein incorporated by reference in its entirety.

STATEMENT REGARDING FEDERALLY SPONSORED RESEARCH OR DEVELOPMENT

This invention was made with government support under Grant Number IIS0757544 awarded by the National Science Foundation. The government has certain rights in the invention.

BACKGROUND

The presently described technology generally relates to digital audio modification. In particular, the presently described technology relates to systems, methods, and apparatus for equalization preference learning for digital audio modification.

In recent decades, audio production tools have increased in performance and decreased in price. These trends have enabled an increasingly broad range of musicians, both professional and amateur, to use these tools to create music. Unfortunately, these tools are often complex and conceptualized in parameters that are unfamiliar to many users. As a result, potential users may be discouraged from using these tools, or may not use them to their fullest capacity.

The parameters provided to users in audio production tools generally reflect the algorithm used to manipulate the sound rather than how manipulating that parameter will influence the way in which that sound is perceived. For example the parameters of an audio equalizer interface might provide the user the ability to increase the gain (in dB) above a particular cutoff frequency (in Hz). However, the perceptual effect of that manipulation might be to make the sound more "bright." Many users approach an audio production tool with an idea of the perceptual effect that they would like to bring about, but may lack the technical knowledge to understand how to achieve that effect using the interface provided.

Equalizers affect the timbre and audibility of a sound by boosting or cutting the level in restricted regions of the frequency spectrum. These devices are widely used for many applications such as mixing and mastering music recordings. Many equalizers have interfaces that are daunting to inexperienced users. Thus, such users often use language to describe the desired change to an experienced individual (e.g., an audio engineer) who performs the equalization manipulation.

Using language to describe the desired change can be a significant bottleneck if the engineer and the novice do not agree on the meaning of the words used. While investigations of the physical correlates of commonly used adjectives have identified some descriptors for which there is considerable agreement across listeners, they have also identified individual differences. For instance, when using the descriptors "warm" and "clear" to describe the timbre of pipe organs, English speakers from the United Kingdom disagreed with those from the United States on the acoustical correlate.

Further complicating the use of language, the same equalizer adjustment might lead to perception of different descriptors depending on the spectrum of the sound source. For example, a boost to the midrange frequencies might "brighten" a sound with energy concentrated in the low-frequencies (e.g., a bass), but might make a more broadband sound (e.g., a piano) appear "tinny." Thus, though there have been several recent attempts to directly map equalizer settings to commonly used descriptors, there are several difficulties to this approach.

An alternative approach that circumvents these problems learns a listener's preference on a case-by-case basis. Perhaps the most studied procedure of this type has been developed for setting the equalization curve of a hearing aid. In what is known as a modified simplex procedure, the spectrum is divided into a low- and a high-frequency channel and each combination of low- and high-frequency gains is represented as points on a grid. On each trial, the listener makes two paired preference judgments: one in which the two settings differ in high frequency gain, and one in which they differ in low frequency gain. The subsequent settings are selected to move in the direction of the preference. Once there is a reversal on both axes, the procedure is complete and the gains are set. While this procedure can be relatively quick, the number of potential equalization curves explored is quite small. Although this procedure could theoretically be expanded to include more variables, the amount of time that this would take quickly becomes prohibitively large.

BRIEF SUMMARY

Systems, methods, and apparatus are provided for equalization preference learning for digital audio modification.

Certain examples provide a method for listener calibration of an audio signal. The method includes generating a plurality of sound/descriptor pairs, each sound/descriptor pair including a sound and an audio descriptor for the sound. The method also includes determining a weighting function based on the plurality of sound/descriptor pairs. The method further includes scaling the weighting function according to listener feedback. The method additionally includes applying the scaled weighting function as an audio device setting for an audio signal.

Certain examples provide a method for listener calibration of an audio signal. The method includes modifying a reference sound using at least one equalization curve. The method also includes playing the modified reference sound for a listener. The method further includes accepting listener feedback regarding the modified reference sound. The method additionally includes generating a weighting function based on listener feedback. The method includes applying the weighting function to an audio signal via an audio device.

Certain examples provide a tangible computer readable medium including computer program code which, when executed by a processor, implements an audio configuration system for individual learning and customization of a listener's subjective audio preference. The system includes an output to provide a sound for listener review. The system also includes an interface to accept listener feedback regarding the sound, the feedback including a descriptor to associate with the sound. The system further includes a processor to program an audio device based on listener feedback. The processor is to analyze the sound and associated listener feedback to generate a weighting function. The weighting function is further scalable based on listener feedback. The processor is to apply the weighting function as an audio device setting for the audio device to apply to an audio signal.

Figure 1:
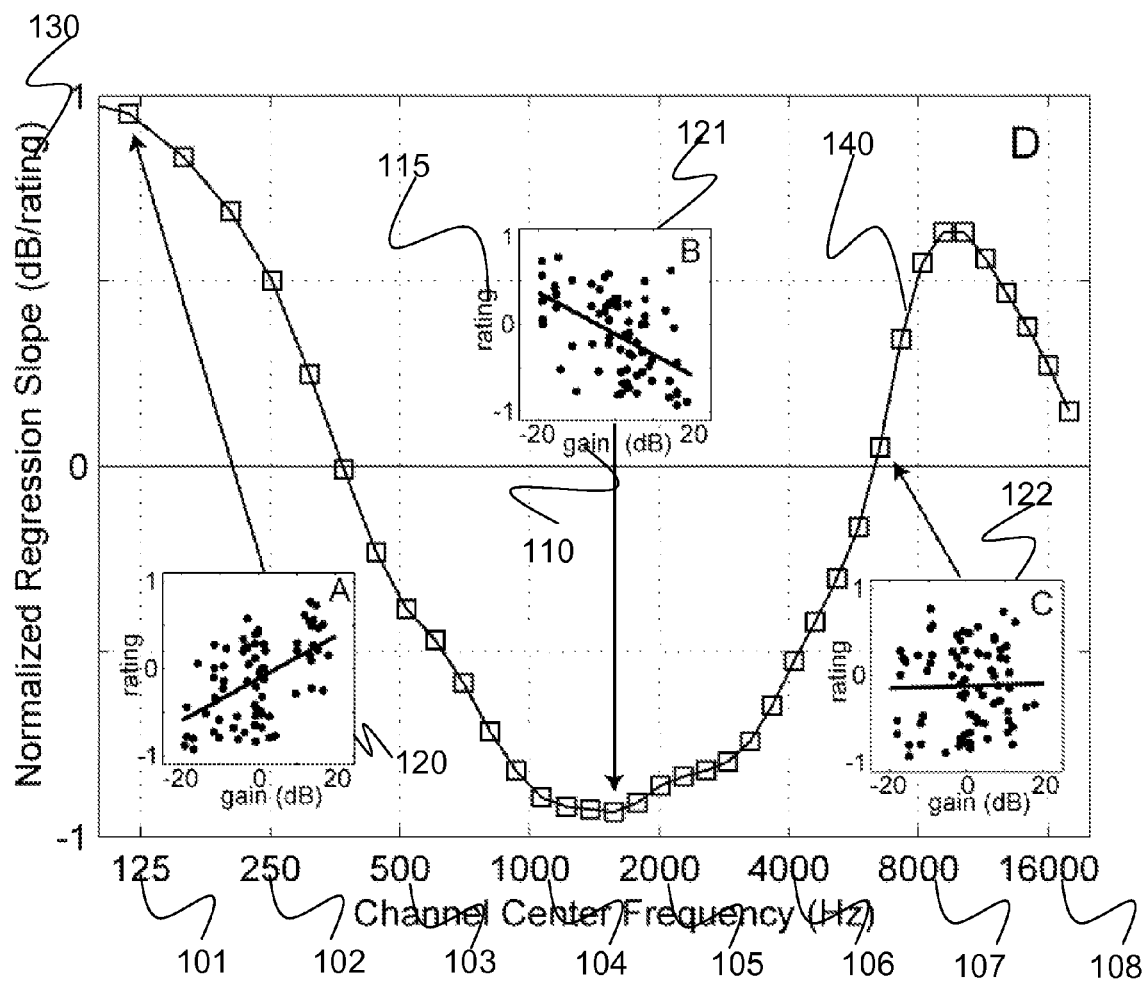
FIG. 1 illustrates an example weighting function.

The foregoing summary, as well as the following detailed description of certain embodiments of the present invention, will be better understood when read in conjunction with the appended drawings. For the purpose of illustrating the invention, certain embodiments are shown in the drawings. It should be understood, however, that the present invention is not limited to the arrangements and instrumentality shown in the attached drawings.

DETAILED DESCRIPTION OF THE INVENTION

Certain examples provide methods and systems for hearing-aid fine tuning that maps language-based descriptors to frequency-gain curves (FGCs). Listeners with hearing loss rate sound samples varying in FGC characteristics according to how well they matched common descriptors. Weighting functions are computed by evaluating the relationship between these ratings and gain values on a band-by-band basis. These functions are highly replicable despite variable ratings, reach asymptotic performance quickly, and are predictive of listener responses. While there are some global similarities about how descriptors mapped to FGC shape, there are also considerable differences in the specifics of that mapping.

Although the following discloses example methods, systems, articles of manufacture, and apparatus including, among other components, software executed on hardware, it should be noted that such methods and apparatus are merely illustrative and should not be considered as limiting. For example, it is contemplated that any or all of these hardware and software components can be embodied exclusively in hardware, exclusively in software, exclusively in firmware, or in any combination of hardware, software, and/or firmware. Accordingly, while the following describes example methods, systems, articles of manufacture, and apparatus, the examples provided are not the only way to implement such methods, systems, articles of manufacture, and apparatus.

When any of the appended claims are read to cover a purely software and/or firmware implementation, in at least one example, at least one of the elements is hereby expressly defined to include a tangible medium such as a memory, DVD, Blu-ray, CD, etc. storing the software and/or firmware.

Virtually all sounds encountered in everyday life include energy across a wide range of frequencies. A common way to modify the timbre (i.e., the tone) of a sound is to boost or cut the energy in restricted frequency ranges. A way in which energy is boosted or cut as a function of frequency is known as the Frequency Gain Curve (FGC). Technical expertise is required to determine the appropriate FGC, usually through an equalizer. Certain examples provide a procedure for enabling novice users to find their preferred FGC.

The FGC is among the most important parameters to consider when fitting a hearing aid. In practice a prescriptive FGC, derived from the audiogram, is initially applied. In a subsequent fine-tuning stage, the patient often communicates his or her concerns about the sound quality using descriptors (e.g., "it sounds hollow"), and the clinician modifies the FGC accordingly. Here, certain examples provide systems and methods that can enhance this process by rapidly mapping descriptors to FGC shapes. These methods and systems can also be used to examine an extent to which there is across-individual agreement in how descriptors map to FGC shapes.

During experimental trials, a sound is processed by a probe FGC and then is played to the user. The user then rates how well that modified sound captured some concept in the user's mind (e.g., how "tinny" was this sound, how "clear" was this sound, . . . etc). The specific sounds and FGC curves can be tailored to the particular application (e.g., if the goal is to optimize speech intelligibility, then speech will be the sound). After several ratings have been collected, the procedure then attempts to determine the relationship between the ratings and the FGCs. In one potential instantiation, at each frequency a linear correlation is computed relating the probe FGC gains at that frequency to the user ratings. The slope of that line is computed at each frequency, and the series of those slopes is referred to as a weighting function. The user is then presented with a single controller that scales the weighting function to the desired extent. The scaled weighting function is the user's preferred FGC. The relationship between gains and ratings need not be a line, but can also take on a curvilinear shape, for example. Further, that relationship need not be computed on a frequency-by-frequency basis, and can be computed with a single procedure such as a multivariate linear regression. Finally, instead of relating gains to ratings, it is also possible to relate ratings to derivatives of those gains such as mel-frequency cepstral coefficients or the coefficients from a principle component analysis, for example.

For example, regression analyses can be conducted to determine a degree to which listener ratings are correlated with the gain values associated with each of twenty-five frequency-bands. An array of slopes of these regression lines across frequency-bands is referred to as the weighting function and is interpreted as the FGC shape that corresponds to the descriptor. This procedure is used to determine the FGC shapes associated with four of the most common descriptors used to describe hearing aid sound quality problems ("tinny", "sharp", "hollow" and "in a barrel, tunnel, or well").

This weighting function shape is highly replicable despite variable listener responses, reached asymptotic performance quickly (e.g., <20 ratings), and is predictive of listener responses. As expected, on a global level, there is some agreement across individuals in how common descriptors mapped to weighting function shape. Over 95% of the variance in the weighting functions can be accounted for by two components: spectral tilt and middle frequency balance. However, considerable differences are observed between individuals in terms of the specifics of that mapping (e.g., slopes, cutoff frequencies, and whether the function was monotonic).

In certain examples, a descriptor-to-FGC mapping can be accomplished by determining individualized changes to the FGC. Given a range of individual differences in the specifics of descriptor-to-FGC mappings observed, this approach can be useful in a clinical setting to easily quantify these acoustic parameters. Implementation of such procedures can lead to more personalized fine-tuning of amplification devices, for example.

FGC determination can be applied in a plurality of domains. For example, FGC determination can be applied to music production. The procedure described above can enable a musician to modify a sound to achieve a particular character (e.g., "make the drums sound warmer") without technical knowledge about how that character was achieved. Alternatively or in addition, FGC determination can be applied to hearing aid fitting. The procedure described above can be used to help hearing aid users modify the sound of their hearing aid to better suit their preference (e.g., "make the hearing aid sound less boomy"). This can be accomplished in the clinic as the hearing aid is being fit, or dynamically as the user enters a difficult listening situation, for example.

In certain examples, an algorithm that rapidly learns a listener's equalization preference on a case-by-case basis and still explores a wide range of settings is presented and evaluated. In this procedure, a relative weight that each portion of the audible frequency spectrum has on the perception of a given descriptor (e.g., "bright" or "warm") is determined by correlating the gain at each frequency band with listener ratings. Thus, the relative perceptual importance of features of a stimulus is determined by the extent to which modifications to each feature are correlated to some perceptual variable.

In an example, an algorithm to rapidly learn a listener's desired equalization curve is described. First, a sound is modified by a series of equalization curves. After each modification, the listener indicates how well the current sound exemplifies a target sound descriptor (e.g., "warm"). After listener rating, a weighting function is computed where the weight of each channel (frequency band or region) is proportional to the slope of the regression line between listener responses and within-channel gain. Listeners report that sounds generated using this function capture their intended meaning of the descriptor. Machine ratings generated by computing the similarity of a given curve to the weighting function are highly correlated to listener responses, and asymptotic performance is reached after few (e.g., ~10-25) listener ratings, for example. This approach can be used to generate a filter that alters the frequency spectrum of a sound as desired without direct manipulation of equalization controls.

Equalizers affect the timbre of a sound by boosting or cutting the level in specific regions of the frequency spectrum. These devices are widely used for many applications such as mixing and mastering music recordings. Equalizers often have interfaces that are daunting to the inexperienced user. Thus, such users typically describe the desired change to an experienced individual (e.g., an audio engineer) who performs the manipulation. This description can be a significant bottleneck if the engineer and the novice do not agree on the meaning of the words used. Indeed there is evidence that certain adjectives have different acoustical meanings across groups of users.

Additionally, for example, it appears that listeners from the US and the UK differ in how they use descriptors such as "warm" and "clear" to describe the sound of pipe organs. While listeners show considerable agreement on the equalizer correlates of some words (e.g., "tinny"), there is a wide range of variability on others (e.g., "warm"). Further complicating the use of a fixed descriptor-to-parameter mapping, the same parameter setting might lead to perception of different descriptors depending on the sound source. For example, a boost to midrange frequencies might "brighten" a sound with energy concentrated in the low frequencies (e.g., a bass guitar), but might make a more broadband sound (e.g., a piano) appear "tinny."

This problem of across-individual descriptor variability can be mitigated if the user's preference is learned on a case-by-case basis. Procedures that learn the user's preference for audio processing on a case-by-case basis have been largely limited to setting the parameters of hearing aids and cochlear implants. Perhaps the most studied technique of this type is the modified simplex procedure. This approach requires the user make a series of paired comparisons differing in high- and low-frequency gain, and these judgments guide the search to converge on the desired setting. While this procedure can be relatively quick, the number of potential equalization curves explored is quite small. Although this procedure could theoretically be expanded to include more variables, the amount of time that this would take quickly becomes prohibitively large. Indeed most of the approaches that learn a user's preference on a case-by-case basis only explore a small range of parameter settings and, therefore, would probably not be sufficient for music production.

To circumvent this bottleneck, systems, methods, and apparatus are provided to rapidly learn a preferred equalization curve by computing a function based on the correlation between user ratings of a series of probe equalization curves and the gain at each frequency region. A user's preferences are learned on a case-by-case basis while still exploring a wide range of parameter settings. The underlying rationale is that the extent to which a particular feature influences the behavioral response will be reflected in the steepness and sign of the slope of a line correlating that feature to the some measure derived from the response (e.g., percent correct). With this in mind, the slope of the line fitted between the stimulus feature value and the behavioral response is computed for all stimulus features, and the combination of those slopes is called the weighting function.

Audio equalizers are perhaps the most common type of processing tool used in audio production. Equalizers affect the timbre and audibility of a sound by boosting or cutting the level in restricted regions of the frequency spectrum. Commercial equalizers often have complex interfaces. In an example, this interface is simplified by building a single personalized controller that manipulates all frequency bands simultaneous to allow a sound to be modified in terms of that descriptor.

In certain examples, a user selects an audio file and a descriptor (e.g., "warm" or "tinny"). The audio file is processed once with each of N probe equalization curves, making N examples. The user rates how well each example sound exemplifies the descriptor. A model of the descriptor is built, estimating the influence of each frequency band on user response by correlating user ratings with the variation in gain of each band over the set of examples. A controller (e.g., a slider) is provided to the user that controls filtering of the audio based on the learned model.

First, to modify the audio, a reference sound is passed through a bank of 40 bandpass filters (channels) with center frequencies spaced approximately evenly on a perceptual scale spanning the range of audible frequencies, and with bandwidths roughly equivalent to the critical band. Then, the sound is modified by adjusting the gain of each channel using a probe equalization curve. For this curve, the gain of each channel is determined by concatenating a set of Gaussian functions with random amplitudes from −20 to 20 dB, and random bandwidths from 5 to 20 channels, for example. Each probe curve in a set is selected to be maximally different from the preceding curves. After the gain is applied, the sound is reconstructed (e.g., the channels are summed) and played to the listener. To reduce or minimize an influence of loudness on user ratings, each presentation is scaled to have the same root-mean-squared (RMS) amplitude.

Each probe equalization curve is created by concatenating Gaussians functions in the space of the 40 channels, with random amplitudes ranging from −20 to 20 dB, and randomly chosen center channels and bandwidths, for example. Each curve is composed of between 2 and 8 Gaussians, each with a width of 5 to 20 channels.

To help ensure that the set of equalization curves has a wide range of within-channel gains, and a similar distribution of across-channel gains, a library of 5000 random probes is first computed. The initial probe equalization curve is randomly selected from the library. Once a curve is selected, it is removed from the library. Then, each subsequent probe was selected by choosing a member of the large population whose gain values were most different from the probes that preceded it. To help ensure a wide range of within-band gain values, and a similar distribution across bands, a probe that increased or maximized within-channel standard deviation of gains is chosen, after imposing a penalty for across-band distribution differences.

For each example used to train the system, the user hears the audio modified by a probe equalization curve. The listener indicates, such as by moving an on-screen slider, how well the modified sound exemplifies a user-determined descriptor (e.g., "warm" or "bright"). Ratings range from 10 (strongly representative) to −10 (strongly opposite), for example. Ratings could also range from −1 (very opposite) to 1 (very), for example. After 20 ratings, a linear regression is computed between the gain in each channel and the user rating. In an example, channels that strongly influence the perception of the descriptor are assumed to have steep regression slopes, while irrelevant channels will have shallow slopes. Therefore, the slope of the regression line for each channel is used as an estimate of the shape of the preferred filter. This is referred to as the weighting function.

Thus, high level language-based descriptors can be quickly mapped to audio processing parameters by correlating user-generated descriptor ratings to parameter values. This approach can be applied to an audio equalizer, etc.

In an example, fourteen listeners participated in an experiment. The average listener age was 29.4 years and the standard deviation was 8.5. All listeners reported normal hearing, and no prior diagnosis of a language or learning disorder. Eight of the listeners reported at least five years of experience playing a musical instrument, and four listeners reported at least four years of experience actively using audio equipment.

In the example, the stimuli were five short musical recordings. The sound sources were a saxophone, a female singer, a drum set, a piano, and an acoustic guitar. Each five second sound was recorded at a Chicago-area recording studio at a sampling rate of 44.1 kHz and bit depth of 16. To modify the spectrum, the sound was first passed through a bank of bandpass filters designed to mimic characteristics of the human peripheral auditory system. Each of the 40 bandpass filters (channels) was designed to have a bandwidth and shape similar to the auditory filter (i.e., critical band). The center frequencies were spaced approximately evenly on a perceptual scale from 20 Hz to 20 kHz. To remove any filter-specific time delay, the filtered sounds were time reversed, passed through the same filter, and time reversed again. Next, a gain value was applied to each channel according to a trial-specific probe equalization curve (e.g., a frequency vs. gain function, as discussed further below). Finally, the channels were summed and shaped by 100 ms on/off ramps. All stimuli were presented at the same root mean square (RMS) amplitude.

In the example experiment, listeners were seated in a quiet room with a computer that controlled the experiment and recorded listener responses. The stimuli were presented binaurally over headphones (e.g., Sony, MDR-7506) and listeners were allowed to adjust the overall sound level to a comfortable volume. Each listener participated in a single one-hour session. Within a session, listening trials were grouped into five runs, one for each stimulus/descriptor combination (e.g., saxophone/bright). The descriptors "bright", "dark", and "tinny" were each tested once, and the descriptor "warm" was tested twice. For all listeners, the descriptor "warm" was always tested with the recordings of the drum set, and the female singer. This pairing was chosen to examine listener and sound-source differences, for example. The remaining three descriptors were randomly assigned to the remaining recordings. The five runs were tested in a randomly determined order. There were 75 listening trials per run.

On each trial in the example experiment, the listener heard the stimulus modified by a probe equalization curve. The listener responded by moving an on-screen slider to indicate the extent to which the current sound exemplified the current descriptor (from −1: "very-opposite", to 1: "very"). Once the listener settled on a slider position, they clicked a button to move on to the next trial. If the full 5-second sound had not finished playing, it was stopped when the button was clicked. To minimize the influence of the preceding stimulus, a 1 second silence was inserted between trials. Before each run, the entire unmodified sound was played to the listener as an example of a "neutral" sound (one which corresponded to the middle position on the slider).

For each listener in the example test, response consistency is estimated using the correlation coefficient (e.g., Pearson's r) between the responses to the identical probe equalization sets. To estimate the quality of the weighting function learned from user responses, the function is computed on one of the probe equalization sets and then tested on the remaining sets (the test set, multiple runs). For each probe equalization curve, a "machine response" is generated by measuring the correlation coefficient between the learned weighting function and each probe equalization curve. Then, the machine respons(es) are correlated with the user responses on the test set. Finally, the number of user responses for the weighting function to reach asymptotic performance is examined The machine versus user correlation is computed as described above using the weighting function computed after each response. In summary, analyses indicate that listeners generate consistent weighting functions that are highly correlated to user responses, and that the weighting function can be learned after only ~20 user responses, for example. Systems, methods, and apparatus can be used to create a tool that lets novice and expert users adjust an equalizer without the need to learn the user interface or directly adjust equalizer parameters.

FIG. 1 illustrates an example weighting function 140. For each channel, a gain on each trial 110 is correlated with an associated listener rating 115. Note that the same ratings are used for every channel 120, 121, 122. The regression line slope 130 is plotted for each channel center frequency 101-108 in the function 140, this function 140 is referred to as the weighting function. The displayed function 140 was obtained from a single listener on a stimulus/descriptor combination of drum set/warm.

In certain examples, listener evaluations of probe curves are used to compute a weighting function that represents the relative influence of each frequency channel on the descriptive word. Given N evaluations, there are N two-dimensional data points per channel. For each point, a gain applied to the channel forms an x-coordinate and a listener rating of how well the sound exemplified the descriptor is a y-coordinate (see, e.g., FIG. 1 A-C). An extent to which a channel influences the perception of the descriptor is reflected in the direction and steepness of the slope of a line fit to this data. Therefore, a slope of the regression line fit to each channel's data is computed. A single multivariate linear regression that simultaneously (or at least substantially simultaneously given a system, memory, processing, transmission, and/or other delay) relates all channels to the rating will not be meaningful in this situation because the gains in adjacent channels are highly correlated to each other, leading to the problem of multicollinearity.

In an example experiment, a weighting function describing the influence of each frequency channel on listener ratings was computed after all trials for a run were completed. For each channel, there were 75 data points, where the within channel gain was on the x-axis and the listener rating of how well the sound exemplified the descriptor was on the y-axis (e.g., 120-122 in FIG. 1). An extent to which a channel influences the perception of the descriptor will be reflected in the steepness of the slope of a line fit to this data set. A slope 130 of the regression line is computed fit to the data set for each channel. Examples of these regression lines are plotted for three channels in insets 120 through 122 of FIG. 1. The channels represented in insets 120 and 121 weigh heavily on the descriptor, albeit in opposite directions, while the channel represented in inset 122 has little weight on the descriptor. Following the terminology used in psychophysics, the array of regression line slopes across all channels will be referred to as the weighting function 140. In all cases the weighting function was normalized by the slope with the largest absolute value.

At the end of each run, the listener was presented with sounds that were modified by scaled versions of the weighting function. A new on-screen slider determined the extent to which the weighting function would be scaled, and a sound was played when the slider was released. The spectrum of that sound was shaped by the normalized weighting function multiplied by a value between −20 and 20, as determined by the position of the slider. This put the maximum point on the equalization curve in a range between −20 and 20 dB. The listeners were free to listen to as many examples as they wanted. Finally, the listener rated how well these modifications represented the descriptor that that they were rating, by moving the position of a new slider on screen where the left end was labeled "learned the opposite," the middle was labeled "did not learn," and the right was labeled "learned perfectly."

In the example experiment, in order to get a good estimate of the weighting functions, the set of probe equalization curves has a wide range of within-channel gains, and a similar distribution of gains across channels. Before each run, a library of 1000 probe equalization curves is computed. Each probe equalization curve was created by concatenating Gaussian functions with random amplitudes from −20 to 20 dB, and with random bandwidths from 5 to 20 channels, for example. When the length of this vector was at least twice the total number of channels (80), concatenation ended. An array of 40 contiguous channels was randomly selected (thereby randomizing the center frequencies of the Gaussian functions) and stored as an element in the library. The probe equalization curve on the first trial was randomly selected from the library. Once a curve was selected, it was removed from the library. The subsequent probe curves are chosen to improve or maximize the across-channel mean of the within-channel standard deviation of gains after imposing a penalty for across-channel distribution differences.

In each run of the example experiment, there were 75 trials, divided into three sets of 25. Two of the sets included an identical set of 25 probe equalization curves. By comparing the two responses to the same curves, consistency in listener responses can be evaluated. The other third included a unique set of curves, which allowed for an examination of the extent to which the weighting function is influenced by the curves that were rated. The three sets of curves were tested in a random order in each run.

First, in the example, consistency in listener responses is assessed by comparing the two responses to the same probe equalization curve. In each run, twenty-five of the probe equalization curves were rated twice, allowing computation of a correlation between the first and second ratings of the same curve. A set of twenty-five probe curves was rated once. The three sets were presented to participants in random order. Across listeners, in sixty of the seventy (85%) total runs, the two sets of rating were significantly correlated to each other ($p<0.05$). The strength of that correlation was assessed by the correlation coefficient, Pearson's r, and the distribution of those values is displayed in the left box 210 of FIG. 2. The median correlation coefficient of 0.69 indicates that, in most cases, the descriptors had some meaning to the listeners, and that they were able to perform the task in a reliable manner.

To assess the quality of the weighting function, machine-generated ratings were compared to listener ratings 211, and also examined the listener's overall feedback 212. For each probe equalization curve, a "machine rating" was generated by assessing similarity to the weighting function using the correlation coefficient computed between the weighting function and each probe equalization curve. A correlation between the machine ratings and the listener ratings was then examined. The machine ratings were significantly correlated with the listener ratings for all seventy runs ($p<0.05$). The distribution of the correlation coefficients for all runs is plotted in the middle box of FIG. 2, and the median value is 0.72. The similarity between the machine vs. listener 211, and the listener vs. listener 210 correlation coefficients suggest that the weighting function captured much of the listener's meaning of the descriptor.

Figure 2:
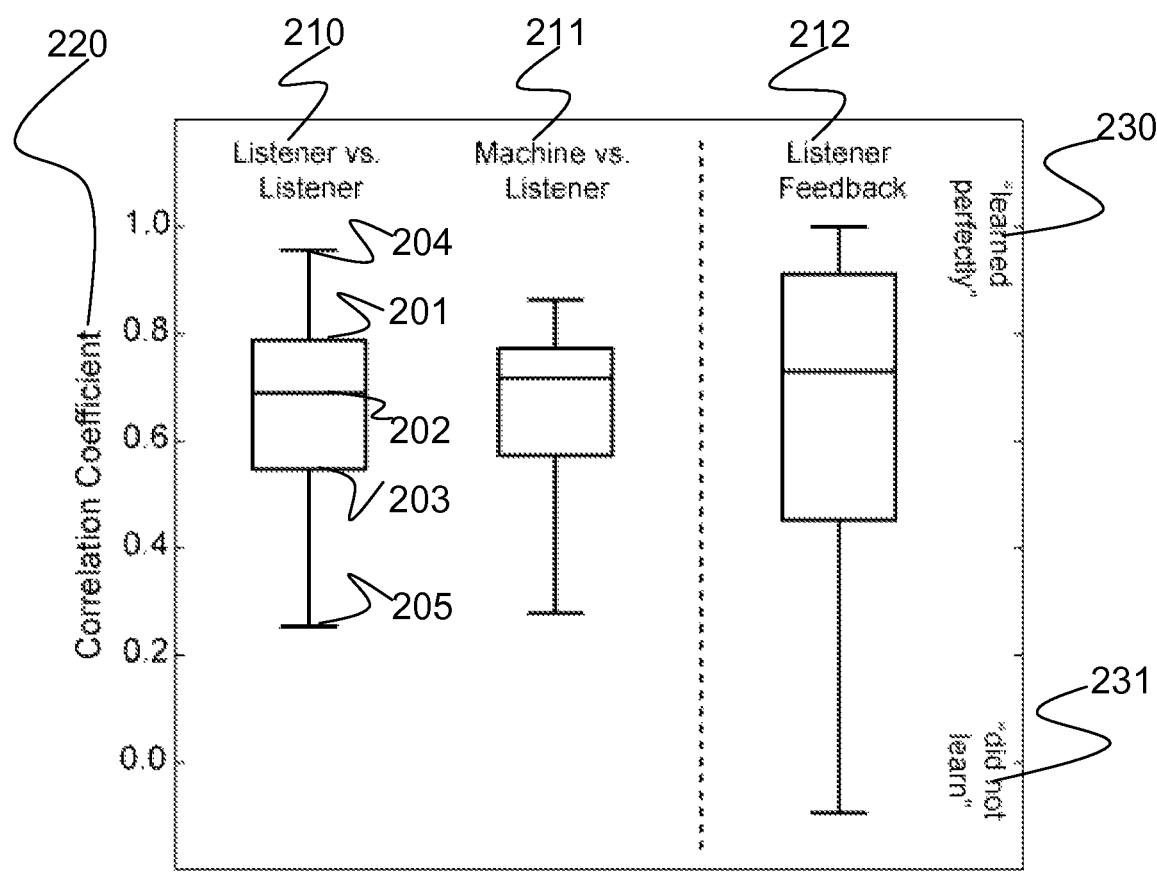
FIG. 2 demonstrates an example of weighting function quality.

FIG. 2 demonstrates an example of weighting function quality. Each box plot represents results of the distribution of a statistic for 95 sound/descriptor pairs. In each box plot 210, 211, 212, the box includes lines at the upper 201, median 202, and lower 203 quartile values, and the whiskers extend to the max/min values 204, 205, or 1.5 times the interquartile range, for example. Outliers are removed from the plot. The box plot 210 on the left is the distribution of correlation coefficients 220 when two responses from the same listener to the same probe equalization curve are correlated to each other (e.g., consistency). The middle box plot 211 is the distribution of machine vs. listener correlation coefficients (e.g., predictiveness). The right box plot 212 is the distribution of listener responses when rating the quality of the learned weighting function (e.g., feedback).

Once the weighting function was learned for each sound/descriptor pair, the listener was provided a slider to modify the sound, where the position of the slider determined the scaling of the weighting function, which was then applied as an equalization curve. After listeners heard sounds that were modified using the scaled versions of the weighting function, the listeners evaluated how well the weighting function learned their intended meaning from −1 (learned the opposite 231) to 1 (learned perfectly 230). The distribution of those values is plotted in the rightmost box plot 212 of FIG. 2. The median value was 0.73, again indicating that the weighting function captured the user's understanding of the descriptor.

Next, a number of listener responses required for the weighting function to reach asymptotic performance was examined. To accomplish this, the weighting function was computed after each of the 75 ratings obtained in the example. Using the same method described above, these weighting functions were used to generate machine ratings for all 75 trials, and those ratings were compared to the listener ratings. The distribution 301 of all machine vs. listener correlation coefficients is plotted in FIG. 3 as a function of the number of responses used to generate the weighting function. The bottom of the grey area 302 indicates the 25th percentile, the top of the grey area 302 indicates the 75th percentile, and the black line 303 is the 50th percentile (the median). From visual inspection, it appears that the weighting function reached asymptotic performance at around 25 trials. However, the higher correlation coefficients appear to reach asymptote earlier (~20 trials) than the lower correlation coefficients (~30 trials).

Figure 3:
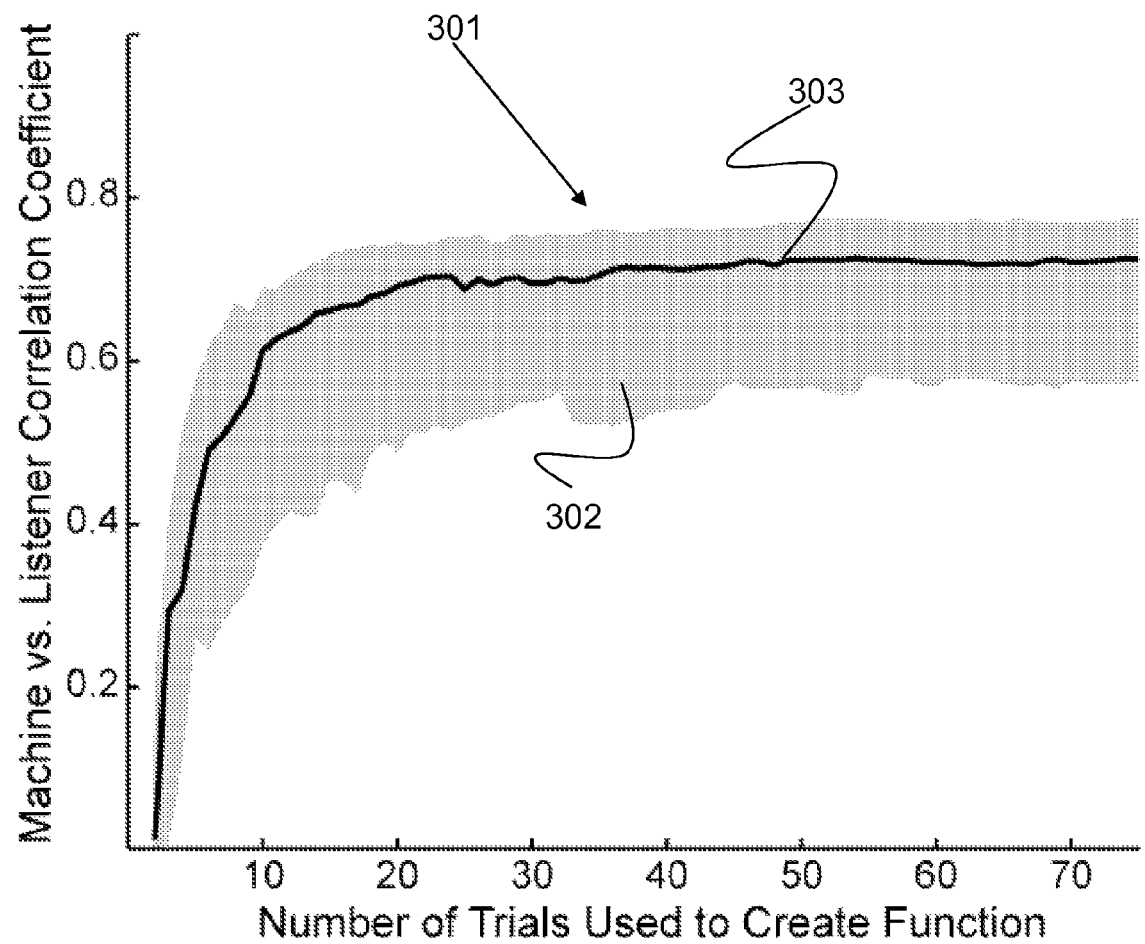
FIG. 3 illustrates an example time course of learning.

FIG. 3 illustrates an example time course of learning. A weighting function was computed after each response and was then used to make a full set of machine ratings. Those machine ratings were correlated to user ratings. The shaded grey area 302 represents the 25th to 75th percentile and the solid black line 303 is the median correlation coefficient. It appears that the weighting function reaches asymptotic performance after ~25 trials.

Figure 4:
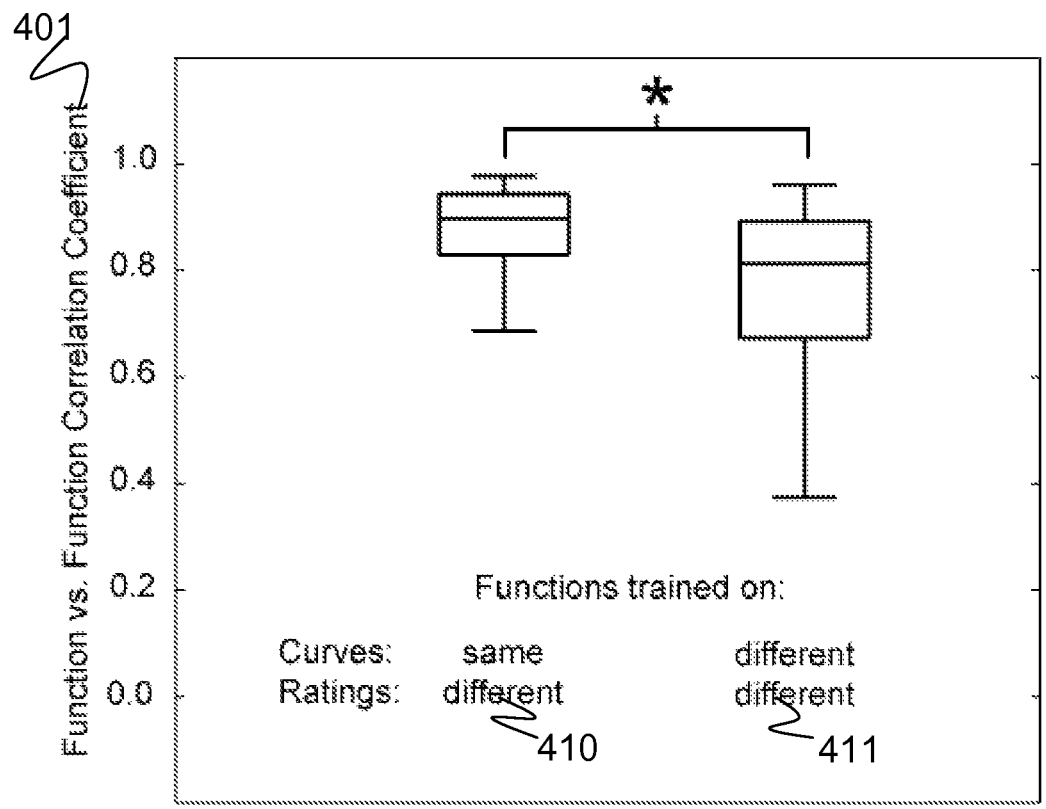
FIG. 4 demonstrates example specificity to probe curves.

Next, in the example, an extent to which the specific set of probe equalization curves influenced the shape of weighting function was examined. For each run, weighting functions were computed on each subset of 25 trials. The similarity between weighting functions was assessed by computing the function vs. function correlation coefficients. The distribution of those values 401 is plotted for functions computed on the same set of probe curves, but different listener ratings (FIG. 4 left 410, median r=0.92), and for functions computed on different sets of probe curves and different ratings (FIG. 4 right 411, median r=0.83). The correlation coefficients 401 were significantly higher for functions computed on the same 410, compared to different 411, sets of probe curves, as assessed by a paired t-test computed after performing Fisher's r-to-z transformation ($p<0.001$). This difference indicates that the specific set of probe curves used has some influence on the shape of the resulting weighting function.

Thus, FIG. 4 demonstrates example specificity to probe curves. The box plots 410, 411 represent the distribution of function vs. function correlation coefficients 401 between weighting functions computed on the same (left) 410 or different (right) 411 sets of probe equalization curves, with *$p<0.001$.

Thus, certain examples provide efficient and effective learning and customization of an individual's subjective preference for an equalization curve. On average, listeners indicated that the weighting function was successful in capturing their intended meaning of a given descriptor. Listener ratings are well predicted by the similarity between a given probe curve and the computed weighting function. Further, the algorithm reached asymptotic performance quickly, after only ~25 trials.

One limitation of the current algorithm is that the shape of the weighting functions is partially influenced by the choice of probe equalization curves. The weighting functions generated by the same set of probe curves were more similar to each other than those generated with a completely different set of probe curves (see, e.g., FIG. 4). The influence of the set of probe equalization curves was possibly due to the fact that the gains were highly correlated across adjacent channels (by definition, the Gaussian functions used to generate the probe curves had bandwidths between 5 and 20 channels).

To illustrate this idea, for example, consider two hypothetical channels adjacent to each other in a weighting function, where one of the channels does not contribute to the perception of a descriptor, but the other does. If the specific probe curves chosen tend to modify the gain of both channels in the same direction, the channel that does not contribute to perception of the descriptor will have a steep slope. However, as the variability in the set of probe curves increases (i.e., as the number of trials increases), the size of this artifact may decrease.

An alternative approach uses probe curves where the gain is set randomly on a channel-by-channel basis. However, pilot experiments using random probe curves indicate that the number of frequency channels should be quite small to yield a meaningful weighting function.

Additionally, certain examples provide a useful tool in a recording studio for situations such as where a novice knows the sound of spectral modification that he/she desires, but is unable to express it in language. An equalizer plug-in can generate probe curves to be rated by the novice, and the plug-in returns a weighting function that can then be scaled to the desired extent. In the example experiment described above, the median trial duration was 3.7 sec and asymptotic performance was reached in approximately 25 trials, so a high quality weighting function could be generated in under two minutes. Examples can also be useful for experienced users who prefer to avoid directly adjusting equalizer parameters. Examples can also be useful in calibrating hearing aids and/or other speaker devices for particular user limitations, preferences, etc. (e.g., according to a user's preferred frequency-gain curve in hearing aid fitting).

Musicians often think about sound in terms that, while they may be well-defined for the individual or a group, do not have known mappings onto the controls of existing audio production tools. Further, many do not have the technical expertise or time to explore the existing parameters to achieve the desired perceptual effect. Certain example systems and methods described herein seek to bridge the gap between the user's concept and the processing tool's controls. Certain examples quickly and automatically map individual subjective sound descriptors onto processing parameters, by correlating user ratings to parameters values.

Figure 5:
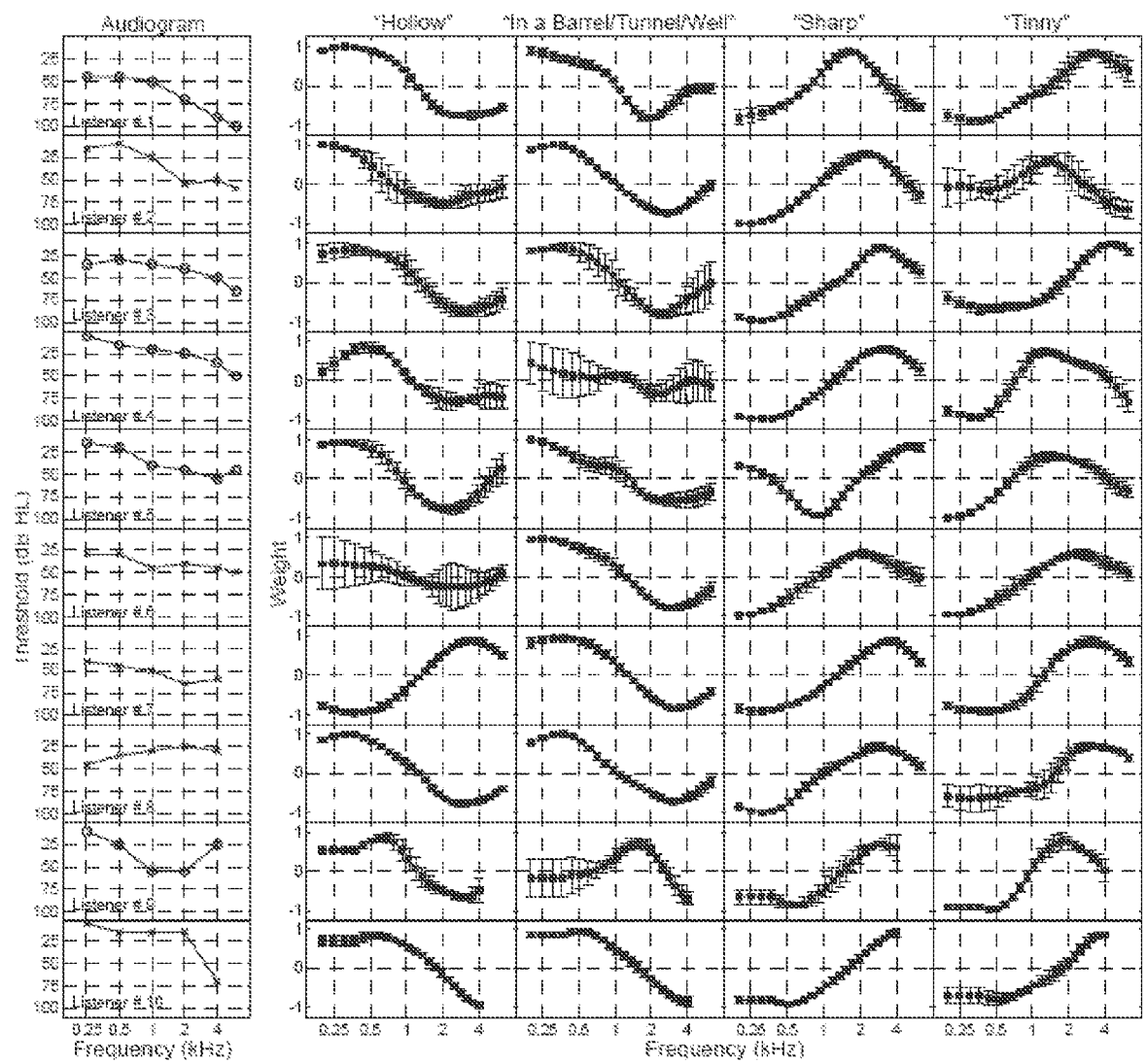
FIG. 5 illustrates individual audiograms and associated average weighting functions.

In certain examples, the weighting function shape can be examined on an individual level to evaluate how the weighting function shape differed across each of the four tested descriptors. The left column of FIG. 5 represents an audiogram, and the other columns indicate the weighting functions for each of the four descriptors, labeled at the top (e.g., "hollow," "in a barrel/tunnel/well", "sharp", "tinny"). In the weighting function plots, the squares along the line represent the across-run average weight associated with each frequency band, and the error bars represents one standard error of that mean. On a global level, there appears to be a fair amount of across-individual agreement. The descriptors "hollow" and "In a barrel/tunnel/well" tend to be associated with negatively sloping spectral tilts, while the reverse is true for the descriptors "tinny" and "sharp." The similarity between these pairs of descriptors is the likely source of the frequent within-pair confusions observed in the matching task. However, these curves do show considerable and consistent within-descriptor variation across individuals in terms of the specific slopes, cutoff frequencies, and whether the function is monotonic. For example, for listener 1, "tinny" was a gradual positively sloping change to frequencies >0.5 kHz (FIG. 5, top row, right column), while for listener 4 it was a steep positive slope starting from about 0.5 to 1 kHz, and a gradual negative slope at higher frequencies (FIG. 5, fourth row, right column). It is noteworthy that the error bars within each panel are typically small. As described earlier, this implies that across-individual differences in weighting function shape are due to individual differences in descriptor-to-FGC mappings rather than measurement error.

Figure 6:
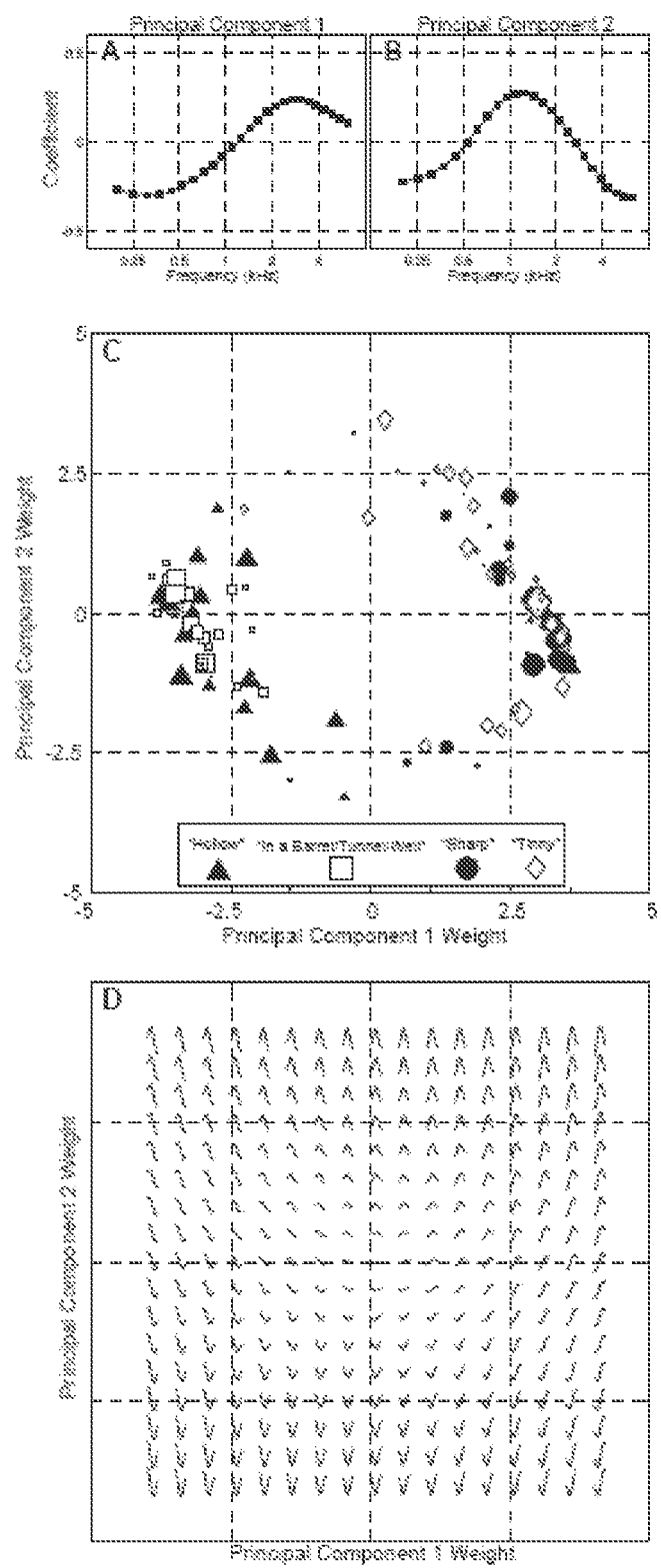
FIG. 6 depicts an example principle component analysis.

Next, to systematically analyze these individual differences, the dimensionality of an example set of 120 weighting functions can be reduced. Principal Component Analysis can be used to determine how well the entire set of weighting functions could be described as a linear combination of a small number of component weighting functions. The first component (a spectral tilt, FIG. 6A) accounts for 78.4% of the (r-squared) variance in the weighting functions. When a second component is added (a modification to the middle frequency balance, FIG. 6B), the two components account for a combined 95.6% of the variance. Beyond these two components, there is only a marginal improvement when additional components are added.

In the example, each of the 120 weighting functions can be described by two parameters: a score associated with each of the two components. The values of these two scores for each weighting function are plotted in FIG. 6C. The left/right position of the point represents the score associated with the first principal component, and the up/down position represents the score associated with the second principal component. The symbol indicates the descriptor that was rated and the size of the symbol indicates the predictiveness associated with that function. The shape of the weighting function associated with locations in this space is plotted in FIG. 6D. In general, the "hollow" and "in a barrel/tunnel/well" weighting functions are on the left side of the graph, indicating a negative spectral tilt, while the opposite is true for the "tinny" and "sharp" weighting functions. This observation is consistent with idea there are global similarities in weighting function mapping across listeners. However, there does not appear to be any regularity in how the points are distributed across the vertical dimension (the second principal component), which is consistent with the idea that the specifics of the descriptor-to-weighting function mapping is idiosyncratic.

Finally, it does not appear that individual differences in weighting function shape have a strong relationship to the shape of the audiogram itself, likely because a prescriptive fit can be applied before adding any probe FGC. To evaluate whether there is an influence of the listener's hearing loss on the shape of the weighting function beyond what is initially accounted for by the prescriptive fit, the pure-tone threshold at each measured frequency was correlated with the absolute value of the average weight at that frequency for each listener/descriptor combination. A slight, but significant, correlation exists between threshold and weight ($r=-0.17$; $p=0.01$). This correlation indicates that there was a slight tendency to give a lower weight to frequencies where hearing threshold was poorer. However, this correlation might simply reflect that low-frequency bands are weighted more highly than high-frequency bands, regardless of hearing loss. In the current group of individuals with hearing loss, the absolute value of the weights for bands below 1 kHz was 32% higher than those above. Individuals with normal hearing showed a similar trend over the same frequency range, weighting low frequency bands 26% higher than high frequency bands. Further, correlation between summary statistics of the weighting function and audiogram summary statistics was examined. There appeared to be no significant correlation between the weighting function and the audiogram in terms of the absolute value of the overall slope ($r=-0.06$, $p=0.73$), the maximum slopes between frequency bands ($r=-0.13$, $p=0.41$), or spectral centroids ($r=-0.09$, $p=0.59$). Taken together, after applying a prescriptive fit based on the audiogram, there appears to be little, if any, additional influence of the audiogram in the descriptor-to-weighting function mapping.

Example systems and methods are described and evaluated herein for mapping descriptors to FGC shape by correlating descriptor ratings to gain on a frequency-band by frequency-band basis. Using these methods, systems, and apparatus, FGC shape associated with common descriptors in a group of individuals with hearing loss can be estimated. While there is some global agreement between individuals in the mapping of these descriptors to FGC shape, there is also considerable individual variability in the specifics of that mapping.

In certain examples, procedural and/or cognitive differences can potentially account for across population consistency differences. On the cognitive level, it is possible that in individuals with hearing loss, the internal representation of the sound samples is degraded, placing a greater strain on cognitive processes such as working memory during the rating task. It appears that an ability to make reliable comparisons between hearing aid parameter settings is related to the working memory capacity of the patient. In certain examples, a procedure that allows the patient to make side-by-side comparisons between FGCs (rather than a serial rating procedure) may place less of a strain on working memory and ultimately lead to more consistent responses. Despite variability in listener ratings, the shape of the weighting function is consistent across test runs. Consistency in weighting function shape may reflect that the number of trials needed to create a meaningful weighting function is quite small when responses are consistent, but, when responses are more variable, additional trials are needed to average out the noise and create a meaningful weighting function. This robustness to listener variability makes this procedure valuable in a clinic, for example.

In certain examples, a weighting-function based method and associated system address some of the issues associated with non-descriptor based fine-tuning procedures. First, most of the previous methods for non-descriptor based fine-tuning split the FGC into only 2 or 3 frequency channels and search for the best gain values for those channels. In an example weighting function procedure described herein, weights are given to each of 25 frequency bands, thereby exploring a much wider range of possible FGC shapes. Second, several of the previous methods are adaptive, gradually approaching the desired FGC, and in such methods, the final FGC is highly dependent upon the initial FGC. Since certain example methods described herein are not adaptive, these methods are not subject to this problem.

Certain examples can be applied to hearing aid users. Certain examples can be applied clinically to give a patient more control of his or her hearing aid in an intuitive way to improve patient satisfaction.

Certain examples could be used to compute a weighting function for a patient-generated descriptor during a fine-tuning stage. A clinician can present a patient with probe FGCs, and the patient can rate how well each probe FGC captured the meaning of the descriptor. The weighting function, which can be measured in minutes, for example, reflects a relative influence of each frequency band on that descriptor. Once the weighting function is measured, the clinician can present the patient with a new slider that scales the actual gain values of each frequency band in proportion to its weight. This effectively creates a slider that is tuned to the descriptor (e.g., a "sharp" slider). The patient can then move that slider to the appropriate position. Further, a patient's preferred hearing aid settings can vary with the particular listening environment. Thus, another example allows the patient to conduct the weighting function measurement procedure outside of the clinic if the weighting function measurement procedure is incorporated into a trainable hearing aid.

An alternative example allows a user to modify sound using space defined by the principal components (see FIG. 6D). The two principal components displayed in FIG. 6A-B can account for more 95% of the variance in the weighting function shapes observed. If these weighting functions are representative of an entire population of weighting functions across different patients and descriptors, then this representation can provide the user with a simple way to modify his or her own FGC. In one alternative, an interface is provided to adjust the weight given to these acoustic parameters, for example, by modifying the FGC within the two-dimensional space of the principle components. An example interface allows the listener to drag a dot in a box, where the horizontal position of the dot alters the weight of principle component 1, and the vertical position alters the weight of principle component 2. As the dot is dragged to the right, the sound becomes more tinny/sharp and as the dot is dragged to the left, the sound becomes more hollow (e.g., as if it were a barrel, tunnel, or well). Similar to the effect of starting slider position described above, this interface can be influenced by the starting position of the dot. The interface can be used by patients outside of a clinic with advances in trainable hearing aids in order to adjust the FGC to adapt to the specific listening environment, for example.

Thus, certain systems and methods described herein determine a relationship between subjective descriptors and FGCs for an individual. Fine tuning procedures can be improved by accounting for individual differences in descriptor-to-parameter mapping.

Additionally, in certain examples, fine tuning can be applied to combinations of audio manipulators. Certain examples provide refinement of controller parameters in non-monotonic space. Additionally, as the number of users of these audio production tools increase, patterns are expected to form in the descriptors they choose to train the tools to manipulate. For example, many users may choose to define "warmth" as an audio descriptor, while few users might select "buttery." Commonalities and differences in chosen concepts and their mappings can help provide insight into the concepts that form a basis of musical creativity in individuals and within communities. An automatic synonym map can be formed based on commonalities between controller mappings (e.g. one person's "bright" may be other person's "tinny").

Figure 7:
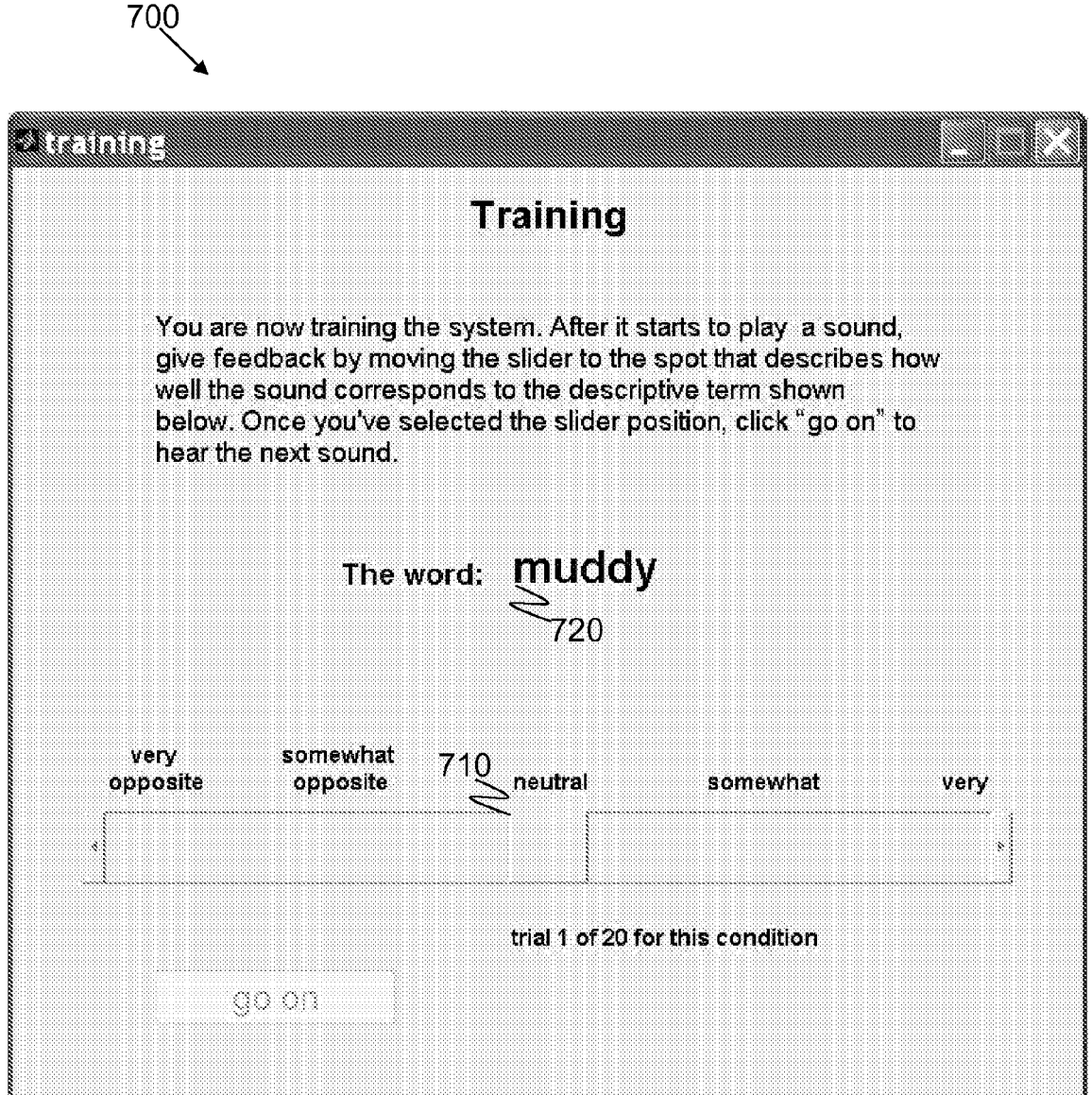
FIGS. 7-9 provide example interfaces used for training, verification, and feedback.
Figure 8:
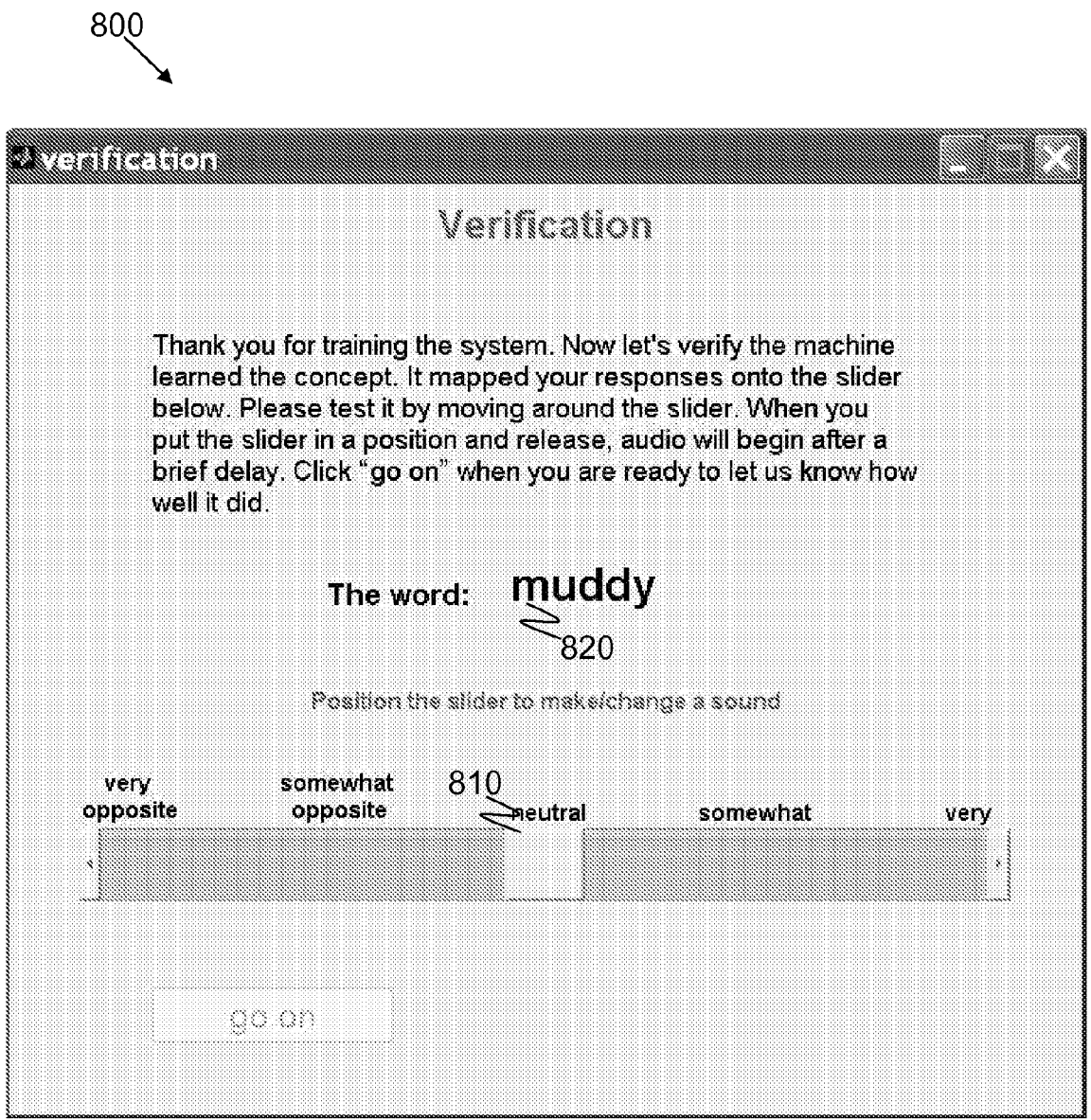
Figure 9:
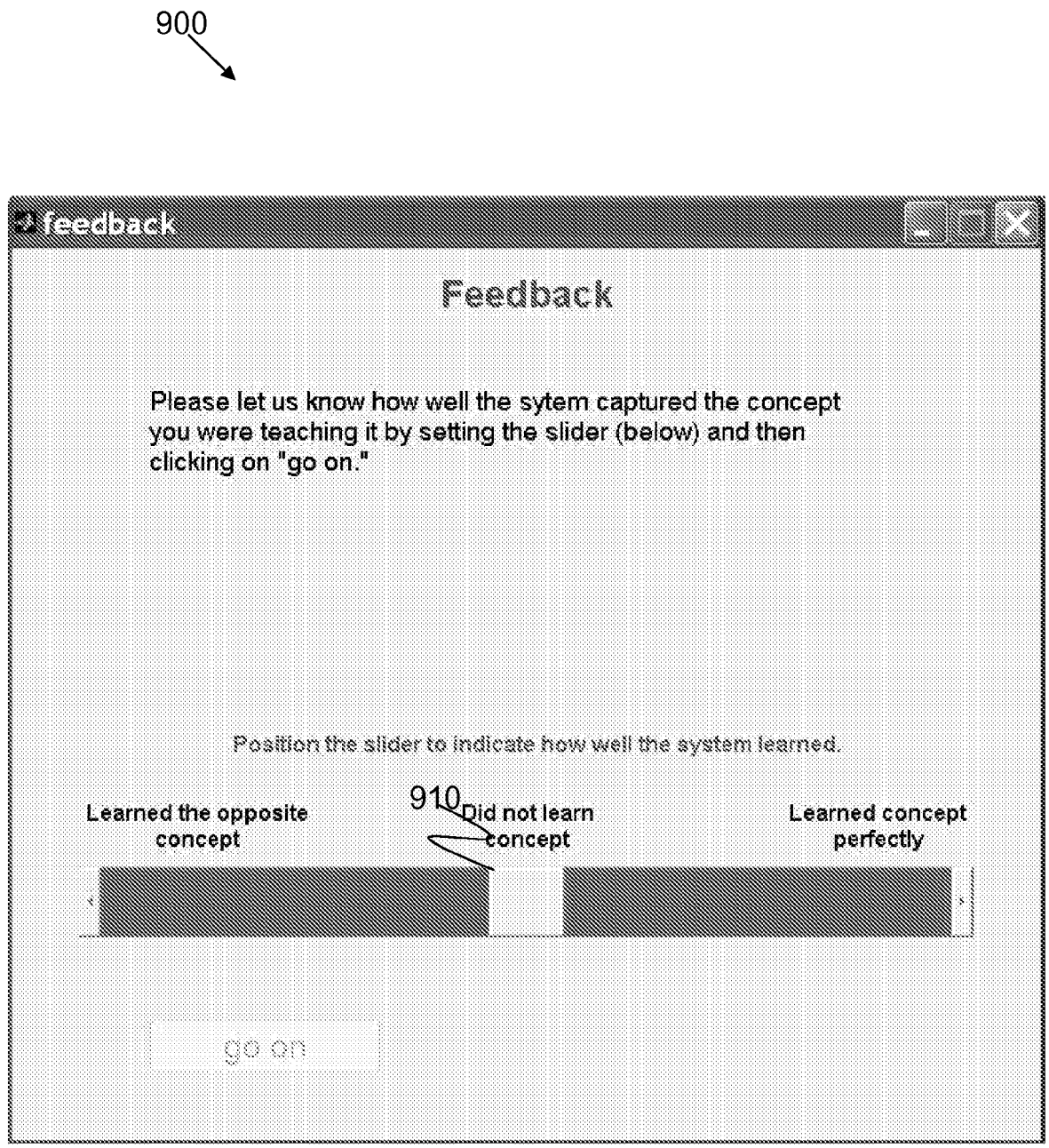

FIGS. 7-9 provide example interfaces 700, 800, 900 used for training, verification, and feedback. As shown, for example, in the training interface 700, a user/listener, when presented with a sound, provides feedback by moving a slider 710 to indicate whether a provided word or qualifier 720 matches the sound heard. Using the verification interface 800, a listener can verify that the machine learned their sound preference. For example, by moving a slider 810, the user can make/change a sound being played according to the provided word 820. Using the example interface 900, a user can provide feedback via a slider 910 to let the machine know how well the system learned user preference.

Using training, generalization, and/or validation trials, a particular filter (e.g., a function that turns up or down various frequency bands according to the shape of the Gaussian mixture described above) can be manually and/or electronically selected, applied to a sound, and rated by a user. By performing a plurality of trials and comparing user responses and computer responses, a determination of an effect of the trials on computer response can be determined.

Using the shape of a mixture of Gaussian function across frequency, the frequency spectrum can be manipulated (e.g. turn up the bass, turn town the treble, etc) in a systematic way. Alternatively, the frequency spectrum can be modified with a line, a sinusoid, a quadratic, etc. At each frequency, the gain (e.g., an amount of boost or cut) is correlated with the response for all trials. The Gaussian function, for example, is used to determine the gain. A relationship between gains and user ratings is fit to a line, a curvilinear shape, etc., to indicate a user's preferred frequency gain curve in the form of a scaled weighting function, for example.

Figure 10:
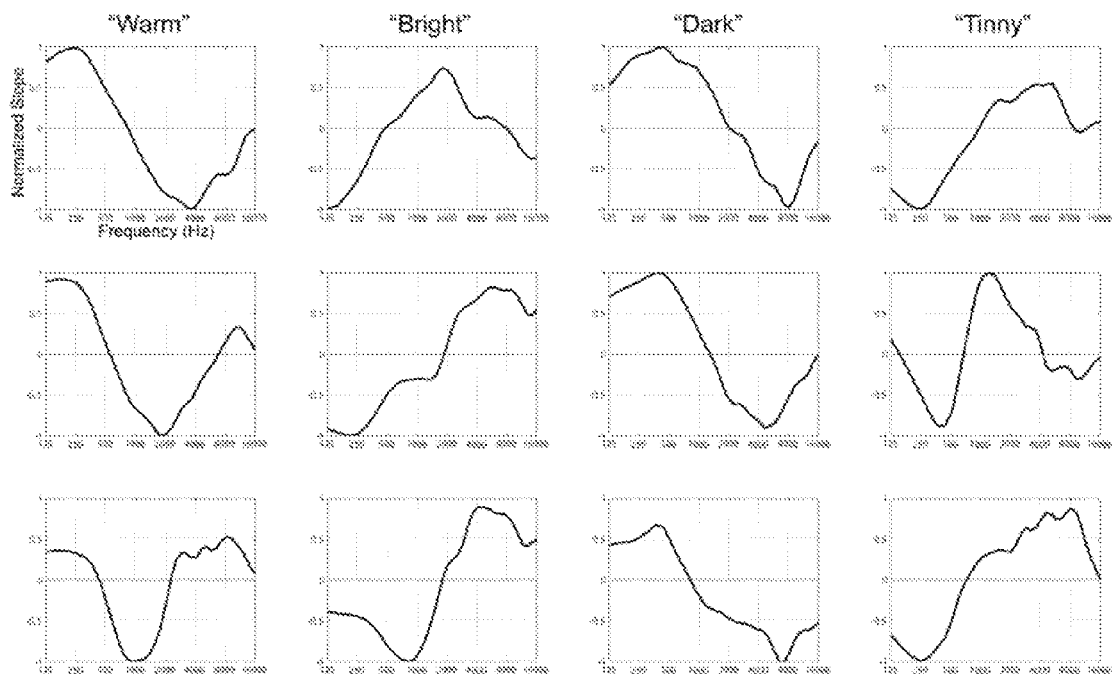
FIG. 10 provides a plurality of example weighting functions for a plurality of sounds based on normalized slope and frequency.
Figure 11:
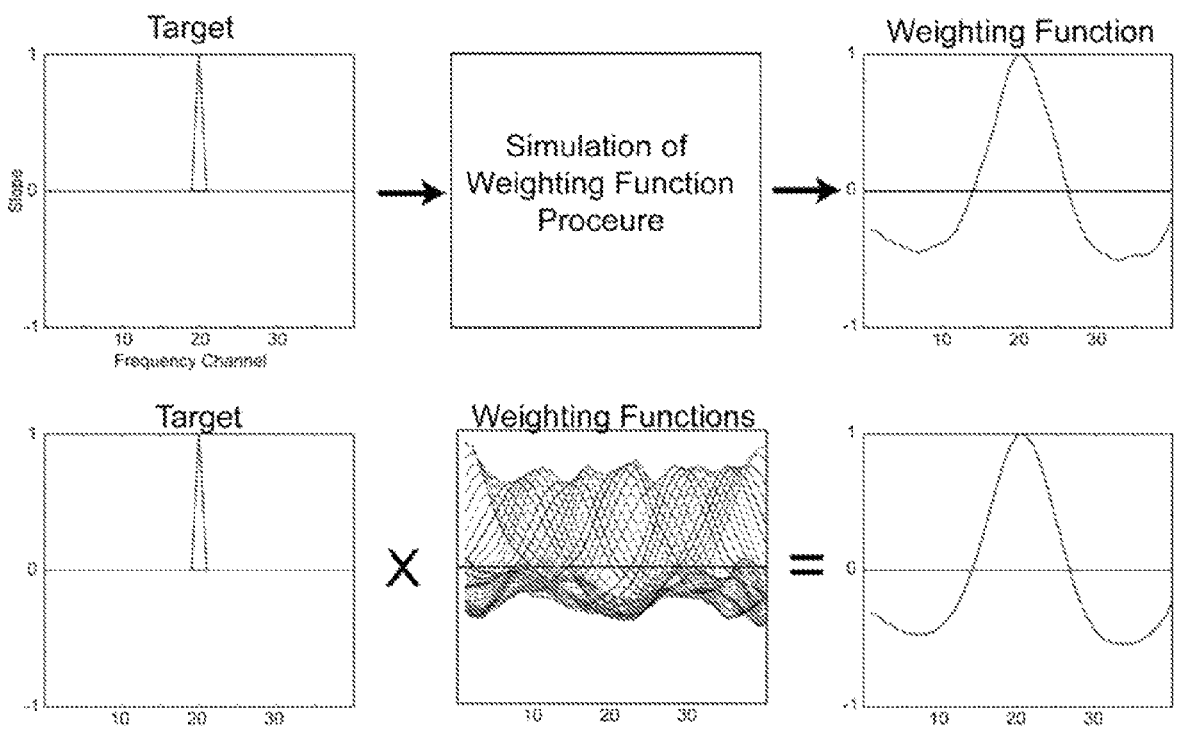
FIG. 11 summarizes an example simulation of machine ratings generated by computing the similarity of a given probe to the weighting function based on user ratings.

FIG. 10 provides a plurality of example weighting functions for "warm," "bright," "dark," and "tinny" sounds as used herein based on normalized slope and frequency (Hz). FIG. 11 summarizes an example simulation of machine ratings generated by computing the similarity of a given probe to the weighting function based on user ratings. Specific probe curves used to "train" example systems, methods, and/or apparatus can influence the shape of the resulting weighting function, for example.

Figure 12:
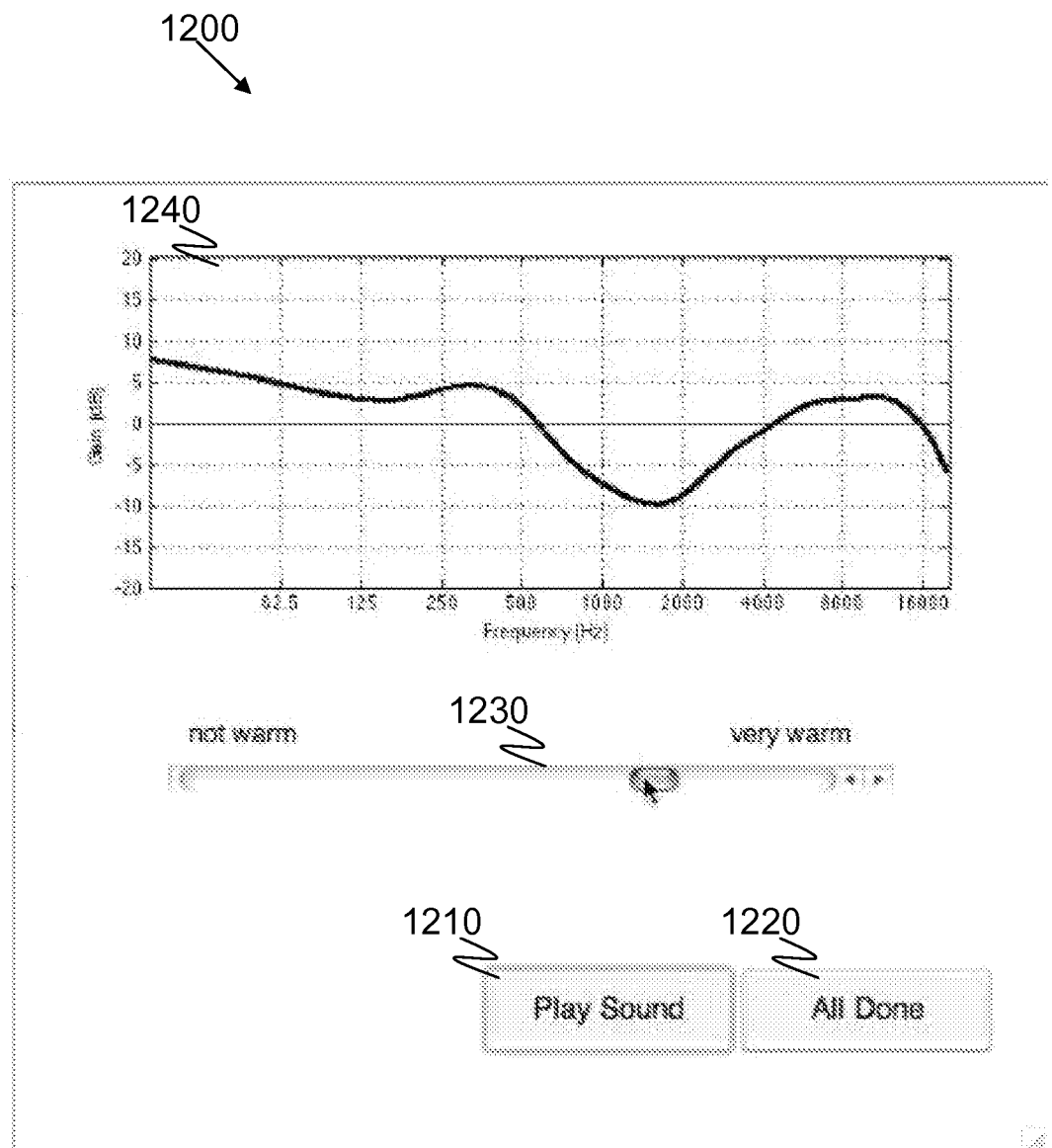
FIG. 12 illustrates an example interface of an application that allows sound adjustments to be made on digital audio equalizers.

FIG. 12 illustrates an example interface of an application 1200 that easily allows sound adjustments to be made on digital audio equalizers. Both amateurs and professionals can use the application 1200 to manipulate sound in a way that automatically matches a listener's desired modification in a short amount of time. Audio equalizers affect the timbre and audibility of a sound, and each listener may have a different preference and may use different terminology to describe a particular sound modification. What is "tinny" or "warm" to one person may not be to another. In fact, studies have shown that listeners apply the word "warm" in very different ways. The application 1200 deals with this discrepancy by learning what equalizer curve best matches each listener's vocabulary.

The application 1200 can be implemented as a pop-up window, dialog box, standalone graphical user interface (GUI), etc., integrated into an audio application or implemented as a separate utility. In one example, the application interface 1200 is integrated into a commercially available digital audio equalizer. The application 1200 is activated by clicking a button opening a pop-up window from the digital equalizer interface. The application 1200 begins by mapping a word to an equalizer curve shape. Using a simple interface, the listener types in a word to be mapped (e.g. "warm," "bright," "dark"). A small number of sound samples are presented (such as by selecting a button 1210), and the listener indicates how well the word describes each sound sample (e.g., using a slider 1230 along a range or scale of values or other such indicator). Behind the scenes, the application 1200 determines the equalization curve 1240 that best fits the user's ratings. Once this process is complete, the listener is presented with a slider 1230 that corresponds to the word they entered (see FIG. 12). When the user has finished calibrating a sound, the user can select a button 1220 to complete calibration and/or advance to the next sound, for example. The application 1200 benefits amateurs who may not understand how to use complex equalizers, and it provides an easier way for professionals to alter sounds to match a particular client's verbal descriptions.

Figure 13:
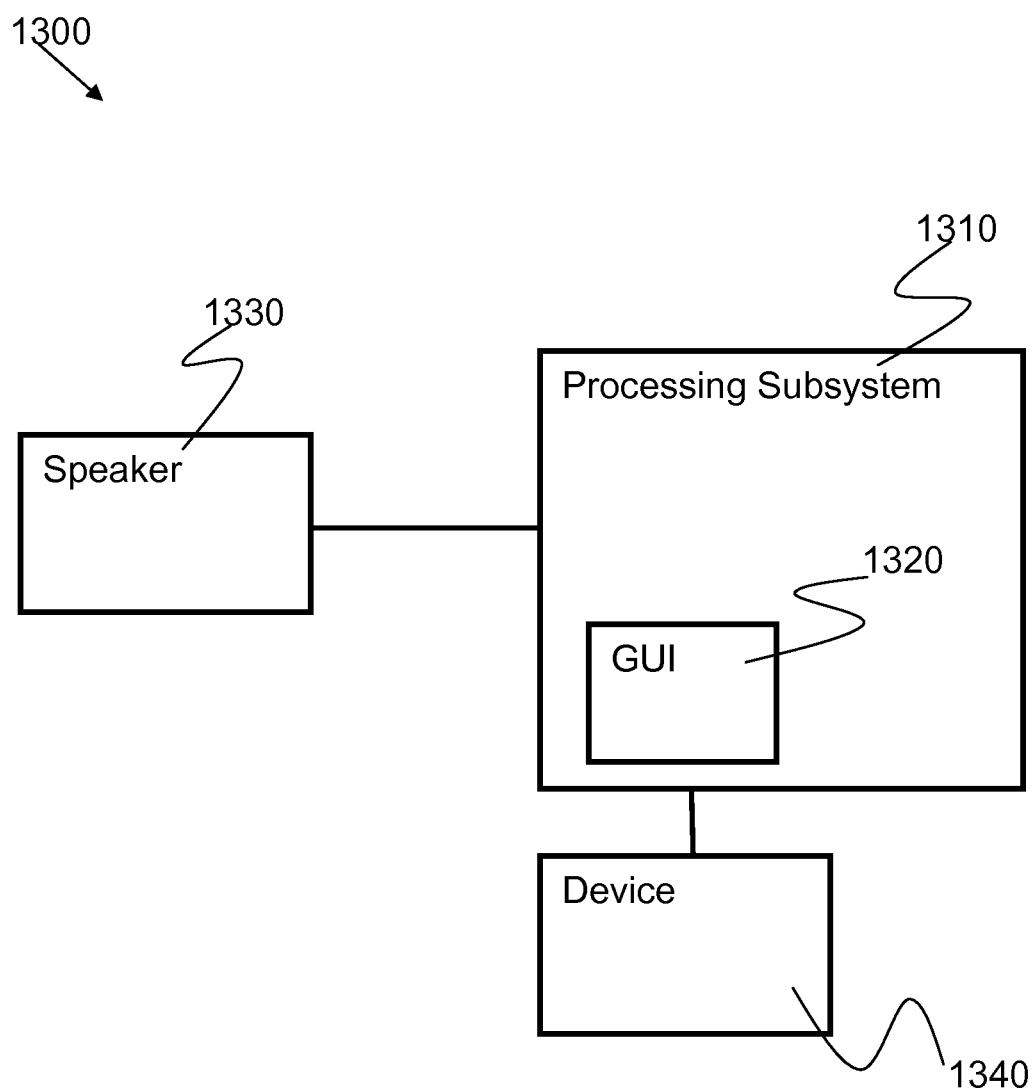
FIG. 13 illustrates an example calibration system to calibrate an audio device based on learned user preference.

FIG. 13 illustrates an example calibration system 1300 to calibrate a device based on learned user preference. The system includes a processing subsystem 1310 including a graphical user interface (GUI) 1320 connected to a speaker 1330. The processing subsystem 1310 is also connected to an electronic device 1340 producing sound for a user. In some examples, the GUI 1320 can be implemented separate from the processing subsystem 1310. The processing subsystem 1310 can be implemented as a personal computer, workstation, mainframe, server, handheld or mobile computing device, embedded circuit, ASIC, and/or other processor, for example. In some examples, the speaker 1330 can include a microphone to accept audio input. The components of the system 1300 can be implemented in a variety of combinations of hardware, software, and/or firmware. The components of the system 1300 can communicate via wired and/or wireless connection(s), for example.

In operation, a user launches a test application on the processing subsystem 1310 via the GUI 1320 after the device 1340 and the speaker 1330 have been connected to the processing subsystem 1310. A listener interacts with the test application via the GUI 1320 as discussed above, such as with respect to FIGS. 1-12. Based on user feedback in training and validation based on sound transmitted by the processing subsystem 1310 through the speaker 1330 and feedback received from the listener through the GUI 1320 (and/or other input), the processing subsystem 1310 can determine a preferred frequency gain curve and corresponding weighting function for that listener. As discussed above, the FGC and weighting function can be used to program the device 1340 (e.g., a hearing aid, equalizer, etc.) for operation tailored to the particular listener's preference/condition.

Figure 14:
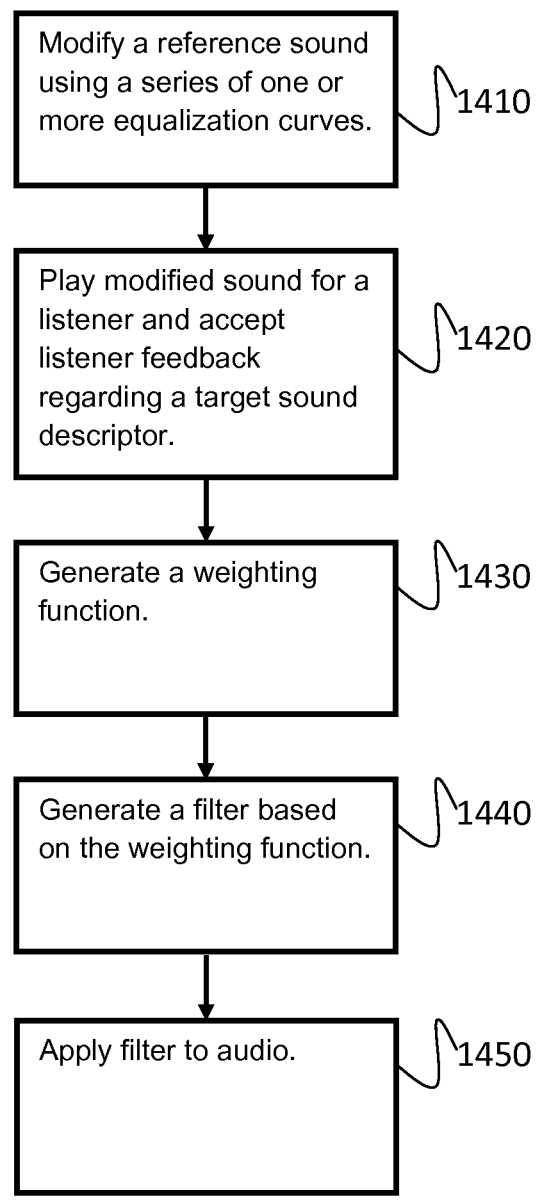
FIG. 14 illustrates an example flow diagram for a method for listener calibration using an equalization curve.

FIG. 14 illustrates a flow diagram for a method 1400 for listener-based audio calibration. FIG. 14 depicts an example flow diagram representative of processes that can be implemented using, for example, computer readable instructions that can be used to facilitate listener calibration and audio output. The example processes of FIG. 14 can be performed using a processor, a controller and/or any other suitable processing device. For example, the example processes of FIG. 14 can be implemented using coded instructions (e.g., computer readable instructions) stored on a tangible computer readable medium such as a flash memory, a read-only memory (ROM), and/or a random-access memory (RAM). As used herein, the term tangible computer readable medium is expressly defined to include any type of computer readable storage and to exclude propagating signals. Additionally or alternatively, the example processes of FIG. 14 can be implemented using coded instructions (e.g., computer readable instructions) stored on a non-transitory computer readable medium such as a flash memory, a read-only memory (ROM), a random-access memory (RAM), a CD, a DVD, a Blu-ray, a cache, or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals.

Alternatively, some or all of the example processes of FIG. 14 can be implemented using any combination(s) of application specific integrated circuit(s) (ASIC(s)), programmable logic device(s) (PLD(s)), field programmable logic device(s) (FPLD(s)), discrete logic, hardware, firmware, etc. Also, some or all of the example processes of FIG. 14 can be implemented manually or as any combination(s) of any of the foregoing techniques, for example, any combination of firmware, software, discrete logic and/or hardware. Further, although the example processes of FIG. 14 are described with reference to the flow diagram of FIG. 14, other methods of implementing the processes of FIG. 14 may be employed. For example, the order of execution of the blocks can be changed, and/or some of the blocks described may be changed, eliminated, sub-divided, or combined. Additionally, any or all of the example processes of FIG. 14 can be performed sequentially and/or in parallel by, for example, separate processing threads, processors, devices, discrete logic, circuits, etc.

FIG. 14 illustrates an example flow diagram for a method 1400 for listener calibration using an equalization curve. At 1410, a reference sound is modified by a series of equalization curves. At 1420, after each modification, the listener indicates how well the filtered sound exemplifies a target sound descriptor (e.g., "warm," "dark," "tinny," etc.). At 1430, a weighting function is generated, where gain in each channel (e.g., frequency region) is proportional to a slope of the regression line between user responses and gain within the channel (e.g., within-channel gain). At 1440, a filter is generated based on the weighting function to alter the frequency spectrum of a sound as desired without direct manipulation of equalization controls. Such a filter can be applied to a music equalizer, a hearing aid, etc.

In further detail, at 1410, the reference sound is modified by adjusting the gain of each frequency band using a probe equalization curve (e.g., by using a single filter or bank of bandpass filters). For this curve, the gain of each channel is determined by concatenating a set of Gaussian functions with random amplitudes and random bandwidths. Each probe curve in a set is selected to be maximally different from the preceding curves.

At 1420, after the gain is applied, the sound is reconstructed and played to the listener. The listener provides feedback, such as by moving an on-screen slider, to indicate how well the modified sound exemplifies a user-determined descriptor (e.g., "warm" or "'bright'").

At 1430, after a series of listener ratings, a linear regression between the gain in each channel and the user rating is computed. A slope of the regression line for each channel is used as an estimate of the shape of the preferred filter, referred to as a weighting function. At 1440, a filter corresponding to the weighted function is generated and provided to modify sound(s) according to listener feedback. At 1450, the filter is applied to the audio. For example, the filter is applied to adjust a hearing aid setting, an audio equalizer, and the like.

Figure 15:
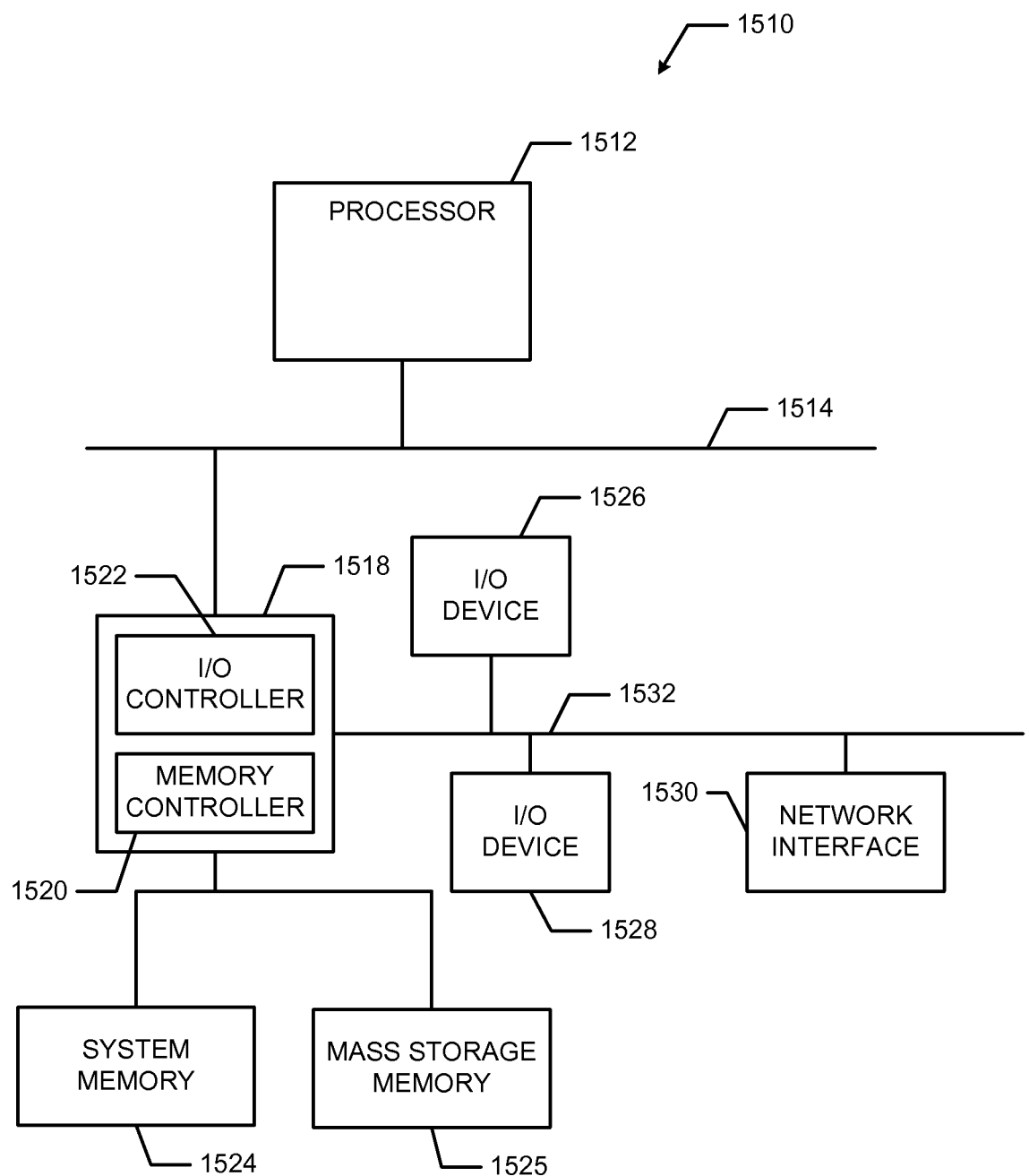
FIG. 15 is a block diagram of an example processor system that may be used to implement systems, apparatus, and methods described herein.

FIG. 15 is a block diagram of an example processor system 1510 that may be used to implement systems, apparatus, and methods described herein. As shown in FIG. 15, the processor system 1510 includes a processor 1512 that is coupled to an interconnection bus 1514. The processor 1512 may be any suitable processor, processing unit, or microprocessor, for example. Although not shown in FIG. 15, the system 1510 may be a multi-processor system and, thus, may include one or more additional processors that are identical or similar to the processor 1512 and that are communicatively coupled to the interconnection bus 1514.

The processor 1512 of FIG. 15 is coupled to a chipset 1518, which includes a memory controller 1520 and an input/output ("I/O") controller 1522. As is well known, a chipset typically provides I/O and memory management functions as well as a plurality of general purpose and/or special purpose registers, timers, etc. that are accessible or used by one or more processors coupled to the chipset 1518. The memory controller 1520 performs functions that enable the processor 1512 (or processors if there are multiple processors) to access a system memory 1524 and a mass storage memory 1525.

The system memory 1524 may include any desired type of volatile and/or non-volatile memory such as, for example, static random access memory (SRAM), dynamic random access memory (DRAM), flash memory, read-only memory (ROM), etc. The mass storage memory 1525 may include any desired type of mass storage device including hard disk drives, optical drives, tape storage devices, etc.

The I/O controller 1522 performs functions that enable the processor 1512 to communicate with peripheral input/output ("I/O") devices 1526 and 1528 and a network interface 1530 via an I/O bus 1532. The I/O devices 1526 and 1528 may be any desired type of I/O device such as, for example, a keyboard, a video display or monitor, a mouse, etc. The network interface 1530 may be, for example, an Ethernet device, an asynchronous transfer mode ("ATM") device, an 802.11 device, a DSL modem, a cable modem, a cellular modem, etc. that enables the processor system 1510 to communicate with another processor system.

While the memory controller 1520 and the I/O controller 1522 are depicted in FIG. 15 as separate blocks within the chipset 1518, the functions performed by these blocks may be integrated within a single semiconductor circuit or may be implemented using two or more separate integrated circuits.

Thus, certain examples can be applied to program and adjust the frequency gain per band for programmable hearing aids and other audio output devices. Gaussian distribution curves of gain vs. frequency band are produced and applied to certain sounds (e.g., someone singing music, etc.) and rated high, low, etc. by a user and/or automated program. Certain examples quickly map a user's particular vocabulary to what the gain distribution should be for a particular kind of word. Data is collected, slopes are plotted, and a distribution is determined.

In some examples, a correction factor is applied for hearing impaired to make sounds audible to them via a hearing aid and/or other speaker. A person's audiogram is identified to determine how to boost a signal so that the person can hear it.

In some examples, a 5-second piano sound recording is repeated as a test sound in each trial with a varying frequency gain curve. When applied to a hearing aid, for example, a variety of speech signals (e.g., adult male, adult female, children, etc.) can be used, and the resulting curve will be affected by the sound sources. Choose whatever sound sources you want to maximize the sound of A wide range of gains can be used at each frequency so that a frequency channel (e.g., 100 Hz) is tested across trials with a boost in gain for some trials, a reduction in gain in some trials, and an unmodified gain in some trials. Additionally, distribution can be made equivalent across channels such that if, in a 100 Hz channel only the gain was boosted an in the 1 Hz channel only the gain was cuts, then the result would be unreliable compared to a uniform distribution of gains within a channel and an equivalent distribution of gains across channels (e.g., if +/−20 dB in one channel, then also want 20 dB across channels). If a particular instrument (e.g., an acoustic guitar) is targeted, then algorithms can be tailored to focus on a particular frequency range. Similarly, characteristics of the listener (e.g., adult, child, hearing impaired, etc.) can result in a tailoring of analysis to a particular frequency range. A more focused range can result in fewer coefficients and faster computation, for example.

Certain embodiments contemplate methods, systems and computer program products on any machine-readable media to implement functionality described above. Certain embodiments may be implemented using an existing computer processor, or by a special purpose computer processor incorporated for this or another purpose or by a hardwired and/or firmware system, for example.

Some or all of the system, apparatus, and/or article of manufacture components described above, or parts thereof, can be implemented using instructions, code, and/or other software and/or firmware, etc. stored on a machine accessible or readable medium and executable by, for example, a processor system (e.g., the example processor system 1510 of FIG. 15). When any of the appended claims are read to cover a purely software and/or firmware implementation, at least one of the components is hereby expressly defined to include a tangible medium such as a memory, DVD, CD, etc. storing the software and/or firmware.

One or more of the components of the systems and/or steps of the methods described above may be implemented alone or in combination in hardware, firmware, and/or as a set of instructions in software, for example. Certain embodiments may be provided as a set of instructions residing on a computer-readable medium, such as a memory, hard disk, DVD, or CD, for execution on a general purpose computer or other processing device. Certain embodiments of the present invention may omit one or more of the method steps and/or perform the steps in a different order than the order listed. For example, some steps may not be performed in certain embodiments of the present invention. As a further example, certain steps may be performed in a different temporal order, including simultaneously, than listed above.

Certain embodiments contemplate methods, systems and computer program products on any machine-readable media to implement functionality described above. Certain embodiments may be implemented using an existing computer processor, or by a special purpose computer processor incorporated for this or another purpose or by a hardwired and/or firmware system, for example.

One or more of the components of the systems and/or steps of the methods described above may be implemented alone or in combination in hardware, firmware, and/or as a set of instructions in software, for example. Certain embodiments may be provided as a set of instructions residing on a computer-readable medium, such as a memory, hard disk, Blu-ray, DVD, or CD, for execution on a general purpose computer or other processing device. Certain embodiments of the present invention may omit one or more of the method steps and/or perform the steps in a different order than the order listed. For example, some steps may not be performed in certain embodiments of the present invention. As a further example, certain steps may be performed in a different temporal order, including simultaneously, than listed above.

Certain embodiments include computer-readable media for carrying or having computer-executable instructions or data structures stored thereon. Such computer-readable media may be any available media that may be accessed by a general purpose or special purpose computer or other machine with a processor. By way of example, such computer-readable media may comprise RAM, ROM, PROM, EPROM, EEPROM, Flash, CD-ROM or other optical disk storage, magnetic disk storage or other magnetic storage devices, or any other medium which can be used to carry or store desired program code in the form of computer-executable instructions or data structures and which can be accessed by a general purpose or special purpose computer or other machine with a processor. Combinations of the above are also included within the scope of computer-readable media. Computer-executable instructions comprise, for example, instructions and data which cause a general purpose computer, special purpose computer, or special purpose processing machines to perform a certain function or group of functions.

Generally, computer-executable instructions include routines, programs, objects, components, data structures, etc., that perform particular tasks or implement particular abstract data types. Computer-executable instructions, associated data structures, and program modules represent examples of program code for executing steps of certain methods and systems disclosed herein. The particular sequence of such executable instructions or associated data structures represent examples of corresponding acts for implementing the functions described in such steps.

Embodiments of the present invention may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the Internet and may use a wide variety of different communication protocols. Those skilled in the art will appreciate that such network computing environments will typically encompass many types of computer system configurations, including personal computers, hand-held devices, multi-processor systems, microprocessor-based or programmable consumer electronics, network PCs, minicomputers, mainframe computers, and the like. Embodiments of the invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing the overall system or portions of embodiments of the invention might include a general purpose computing device in the form of a computer, including a processing unit, a system memory, and a system bus that couples various system components including the system memory to the processing unit. The system memory may include read only memory (ROM) and random access memory (RAM). The computer may also include a magnetic hard disk drive for reading from and writing to a magnetic hard disk, a magnetic disk drive for reading from or writing to a removable magnetic disk, and an optical disk drive for reading from or writing to a removable optical disk such as a CD ROM or other optical media. The drives and their associated computer-readable media provide nonvolatile storage of computer-executable instructions, data structures, program modules and other data for the computer.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The invention claimed is:

1. A method for listener calibration of an audio signal, said method comprising:
   generating a plurality of sound/descriptor pairs, each sound/descriptor pair including a sound and an audio descriptor for the sound;
   determining a weighting function based on the plurality of sound/descriptor pairs;
   scaling the weighting function according to listener feedback;
   applying the scaled weighting function as an audio device setting for an audio signal; and
   mapping one or more language based descriptors associated with the plurality of sound/descriptor pairs to one or more frequency gain curves,
   wherein the one or more frequency gain curves are mapped to the weighting function, wherein a slope of a line fitted between the values of the plurality of sound/descriptor pairs is computed for each sound/descriptor pair and wherein a combination of the plurality of slopes represents the weighting function.

2. The method of claim 1, further comprising receiving listener feedback regarding the weighting function via a controller.

3. The method of claim 1, further comprising modifying one or more sounds associated with the plurality of sound/descriptor pairs using at least one equalization curve.

4. The method of claim 1, further comprising receiving listener feedback regarding a plurality of high and low frequency gain comparisons to converge to a desired scaled weighting function.

5. A tangible computer readable medium comprising computer program code which, when executed by a processor, implements an audio configuration system for individual learning and customization of a listener's subjective audio preference, said system comprising:
   an output to provide a sound for listener review;
   an interface to accept listener feedback regarding the sound, the feedback including a descriptor to associate with the sound; and
   a processor to program an audio device based on listener feedback, wherein the processor is to analyze the sound and associated listener feedback to generate a weighting function, the weighting function further scalable based on listener feedback, wherein the processor is to apply the weighting function as an audio device setting for the audio device to apply to an audio signal and the processor is to predict listener ratings based on a similarity between a probe curve and the weighting function.

6. The computer readable medium of claim 5, wherein the interface further comprises a slider controller to receive listener feedback regarding the weighting function.

7. The computer readable medium of claim 5, wherein the processor is to modify the sound using at least one equalization curve.

8. The computer readable medium of claim 5, wherein the processor is to map a language-based descriptor associated with the sound to a frequency gain curve.

9. The computer readable medium of claim 8, wherein the processor is to map the frequency gain curve to the weighting function.

10. The computer readable medium of claim 5, wherein the interface is to receive listener feedback regarding a plurality of high and low frequency gain comparisons to converge to a desired scaled weighting function.

11. The computer readable medium of claim 5, wherein the audio device comprises at least one of a hearing aid and an audio equalizer.

12. The computer readable medium of claim 5, further comprising one or more bandpass filters to modify the sound for output.

13. The computer readable medium of claim 5, further comprising an automatic synonym map relating language-based descriptors representing listener feedback.

14. A tangible computer readable medium comprising computer program code which, when executed by a processor, implements an audio configuration system for individual learning and customization of a listener's subjective audio preference, said system comprising:

an output to provide a sound for listener review;
an interface to accept listener feedback regarding the sound, the feedback including a descriptor to associate with the sound;
an automatic synonym map relating language-based descriptors representing listener feedback; and
a processor to program an audio device based on listener feedback, wherein the processor is to analyze the sound and associated listener feedback to generate a weighting function, the weighting function further scalable based on listener feedback, wherein the processor is to apply the weighting function as an audio device setting for the audio device to apply to an audio signal.

15. The computer readable medium of claim 14, wherein the interface further comprises a slider controller to receive listener feedback regarding the weighting function.

16. The computer readable medium of claim 14, wherein the processor is to modify the sound using at least one equalization curve.

17. The computer readable medium of claim 14, wherein the processor is to map a language-based descriptor associated with the sound to a frequency gain curve.

18. The computer readable medium of claim 17, wherein the processor is to map the frequency gain curve to the weighting function.

19. The computer readable medium of claim 14, wherein the interface is to receive listener feedback regarding a plurality of high and low frequency gain comparisons to converge to a desired scaled weighting function.

20. The computer readable medium of claim 14, wherein the audio device comprises at least one of a hearing aid and an audio equalizer.

21. The computer readable medium of claim 14, further comprising one or more bandpass filters to modify the sound for output.

22. The computer readable medium of claim 14, wherein the processor is to predict listener ratings based on a similarity between a probe curve and the weighting function.

* * * * *